United States Patent
Yamashita

(10) Patent No.: US 6,205,570 B1
(45) Date of Patent: Mar. 20, 2001

(54) METHOD FOR DESIGNING LSI CIRCUIT PATTERN

(75) Inventor: Kyoji Yamashita, Kyoto (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/092,396

(22) Filed: Jun. 5, 1998

(30) Foreign Application Priority Data

Jun. 6, 1997 (JP) .................................. 9-149048

(51) Int. Cl.$^7$ ................................... G06F 17/50
(52) U.S. Cl. ....................... 716/1; 716/2; 716/6
(58) Field of Search ............................ 395/500.02; 716/1

(56) References Cited

FOREIGN PATENT DOCUMENTS

| | | |
|---|---|---|
| 6-13590 | 1/1994 | (JP) . |
| 6-244176 | 9/1994 | (JP) . |
| 7-122554 | 5/1995 | (JP) . |
| 7-142604 | 6/1995 | (JP) . |
| 7-169842 | 7/1995 | (JP) . |
| 9-293786 | 11/1997 | (JP) . |

OTHER PUBLICATIONS

F. Pintchovski, Progression of Multilevel Metallization Beyond 0.35 micron Technology, International Electron Devices Meeting, Dec. 1994.*

R. Hojati, Layout Optimization by Pattern Modification, 27th ACM/IEEE Design Automation Conference, pp. 632–637, Oct. 1990.*

V. N. Rayapati et al., Interconnect Propagation Delay Modeling and Validation for the 16–MB CMOS SRAM Chip, IEEE Transactions on Components, Packaging, and Manufacturing Technology, pp. 605–614, Aug. 1996.*

Yao–Wen Chang et al. On A New Timing–Driven Routing Tree Problem, IEEE International Symposium on Circuits and Systems, pp. 420–423, May 1996.*

V. Adler et al. Repeater Insertion to Reduce Delay and Power in RC Tree Structures, 31st Asilomar Conference on Signals, Systems, and Computers, pp. 749–752, Nov. 1997.*

V. Adler et al., Repeater Design to Reduce Delay and Power in Resistive Interconnect, IEEE International Symposium on Circuits and Systems, pp. 2148–2151, Jun. 1997.*

(List continued on next page.)

*Primary Examiner*—Paul R. Lintz
*Assistant Examiner*—A. M. Thompson
(74) *Attorney, Agent, or Firm*—Ratner & Prestia

(57) ABSTRACT

A method of designing an LSI circuit pattern which connects a plurality of gates on an LSI chip. The method estimates a chip area of the LSI chip and a number of the plurality of gates required for achieving a desired function; estimates an interconnect length of each of the plurality of gates; designs a wiring pattern associated with the each of the plurality of gates based on a prescribed design rule, and calculates a gate delay time for the design wiring pattern; alters the design rule as necessary if the calculated gate delay time exceeds a prescribed target value, while calculating the total area occupied by the designed wiring patterns when the calculated gate delay time is within a prescribed target value. The process sequentially repeats for a gate having a next shortest interconnect length when the calculated total area occupied by the designed wiring patterns does not exceed the estimated chip area. When the calculated total area occupied by the designed wiring patterns exceeds the estimated chip area, add one new metal layer and sequentially repeat the process for the gate having a next shortest interconnect length on the added metal layer.

13 Claims, 15 Drawing Sheets

OTHER PUBLICATIONS

C. Alpert et al., Wire Segmenting for Improved Buffer Insertion, Proceedings, 34th Design Automation Conference, pp. 588–593, Jun. 1997.*

S. Turgis et al., Design and Selection of Buffers for Minimum Power–Delay Product, Proceedings of the European Design and Test Conference, pp. 224–228, Mar. 1996.*

T. Koide et al. , Pin Assignment with Global Routing for VLSI Building Block Layout, IEEE Transactions on Computer–Aided Design of Integrated Circuits and Systems, pp. 1575–1583, Dec. 1996.*

T. Koide, A Timing–Driven Global Routing Algorithm with Pin Assignment, Block Reshaping, and Positioning for Building Block Layout, Design Automation Conference 1998, pp. 577–583, Feb. 1998.*

R. Hojati, Transformation–Based Layout Optimization, IEEE Custom Integrated Circuits Conference, pp. 30.5/1–30.5/4, May 1990.*

W. Kubitz, A Performance–Driven Global Router for Custom VLSI Chip Design, IEEE Transactions on Computer–Aided Design of Integrated Ciruits and Systems, pp. 1044–1051, Aug. 1992.*

J. Cong, Pin Assignment with Global Routing for General Cell Designs, IEEE Transactions on Computer–Aided Design of Integrated Circuits and Systems, pp. 1401–1412, Nov. 1991.*

T. Suzuki et al., A Timing–Driven Global Routing Algorithm Considering Channel Density Minimization for Standard Cell Layout, IEEE International Symposium on Circuits and Systems, pp. 424–427, May 1996.*

J. Cong, Pin Assignment with Global Routing, IEEE International Conf. on Comutper–Aided Design, pp. 302–305, Nov. 1989.*

Pei–Lin Pai et al., Copper as the Future Interconnection Material, 1989 VMIC Conference, pp. 258–264, Jun. 1989.*

R. Hojati, Timing Driven Routing and Resistivity Minimization, IEEE Custom Integrated Circuits Conference, pp. 28.1/1–28.1/5, May 1991.*

W. Kubitz et al., A Timing–Driven Global Router for Custom Chip Design, IEEE International Conference on Computer–Aided Design, pp. 48–51, Nov. 1990.*

A. Kahng et al., Efficient Gate Delay Modeling for Large Interconnect Loads, IEEE Multi–Chip Module Conference, pp. 202–207, Feb. 1996.*

C. Ratzlaff et al., Modeling the RC–Interconnect Effects in a Hierarchical Timing Analyzer, IEEE Custom Integrated Circuits Conference, pp. 15.6.1–15.6.4, May 1992.*

K. Sato et al., Post–Layout Optimization for Deep Submicron Design, 33rd Design Automation Conference, pp. 1–6, Jan. 1996.*

J. Cong et al., Provably Good Performance Driven Global Routing, IEEE Transactions on Computer–Aided Design of Integrated Circuits and Systems, pp. 739–752, Jun. 1992.*

Y. Ismail et al., Optimum Repeater Insertion based on a CMOS delay model for on–chip RLC Interconnect, IEEE International AsIC Conference, pp. 369–373, Sep. 1998.*

J. Paraszczak et al., "High performance dielectrics and processes for ULSI interconnection technologies", *IEDM 93*, pp. 261–264, 1993.

H. B. Bakoglu et al., "Optimal Interconnection Circuits for VLSI", *IEEE Transactions on Electron Devices*, vol. ED–32, No. 5, pp. 903–909, 1985.

G. A. S. –Halasz, "Performance Trends in High–End Processors", *Proceedings of the IEEE*, vol. 83, No. 1, pp. 20–36, 1995.

M. T. Bohr, "Interconnect Sealing—The Real Limiter to High Performance ULSI", *IEDM 95*, pp. 241–244, 1995.

K. Rahmat et al., "A Scaling Scheme for Interconnect in Deep–Submicron Processes", *IEDM 95*, pp. 245–248, 1995.

J. A. Davis et al., "Optimal Low Power Interconnect Networks", *1996 Symposium on VLSI Technology Digest of Technical Papers*, pp. 78–79, 1996.

\* cited by examiner

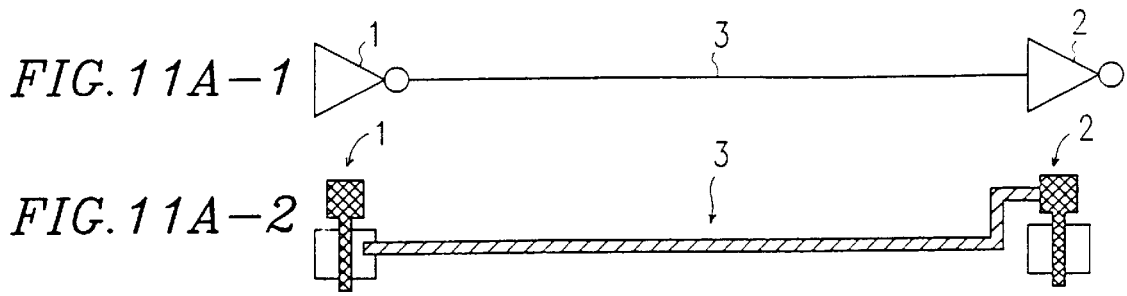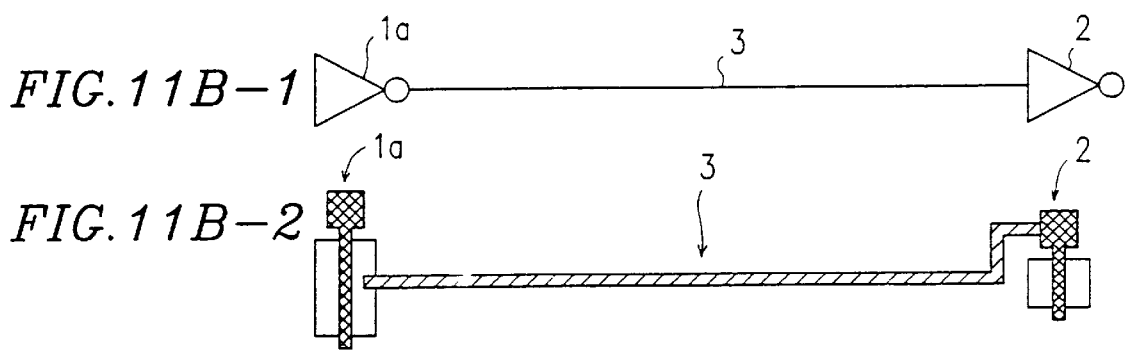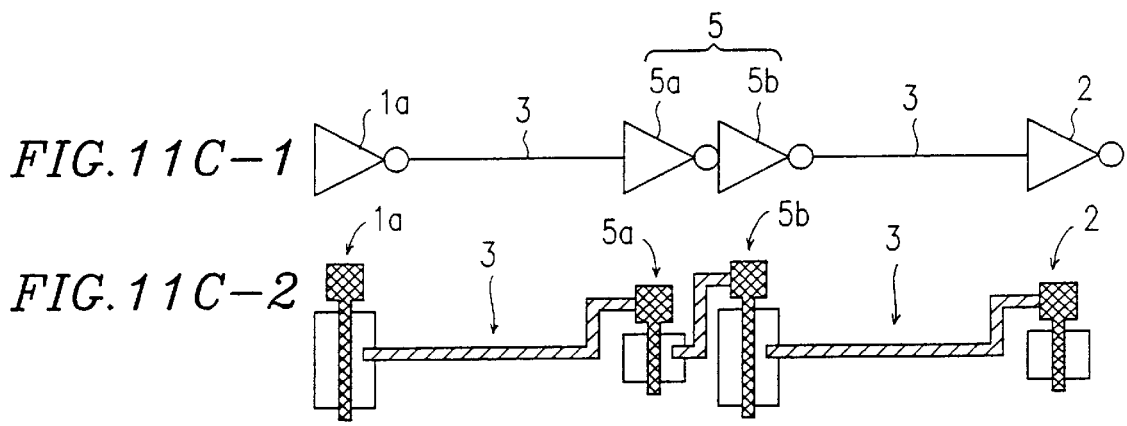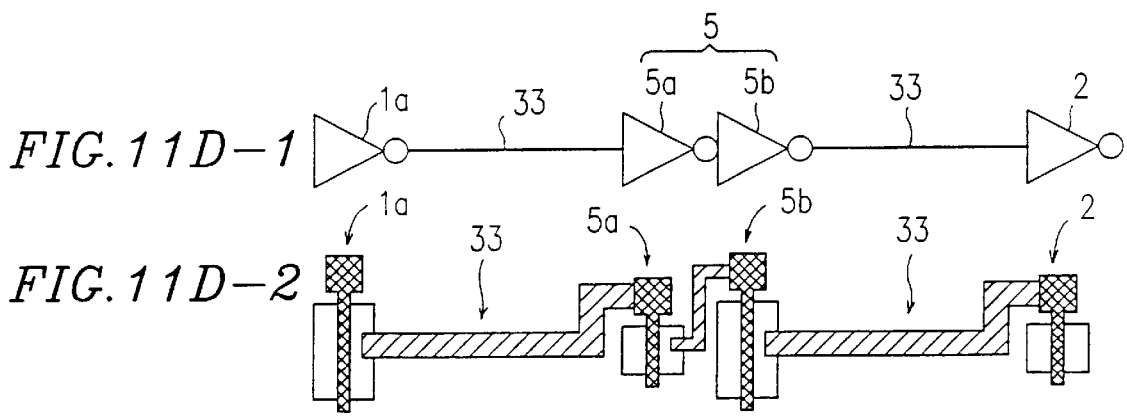

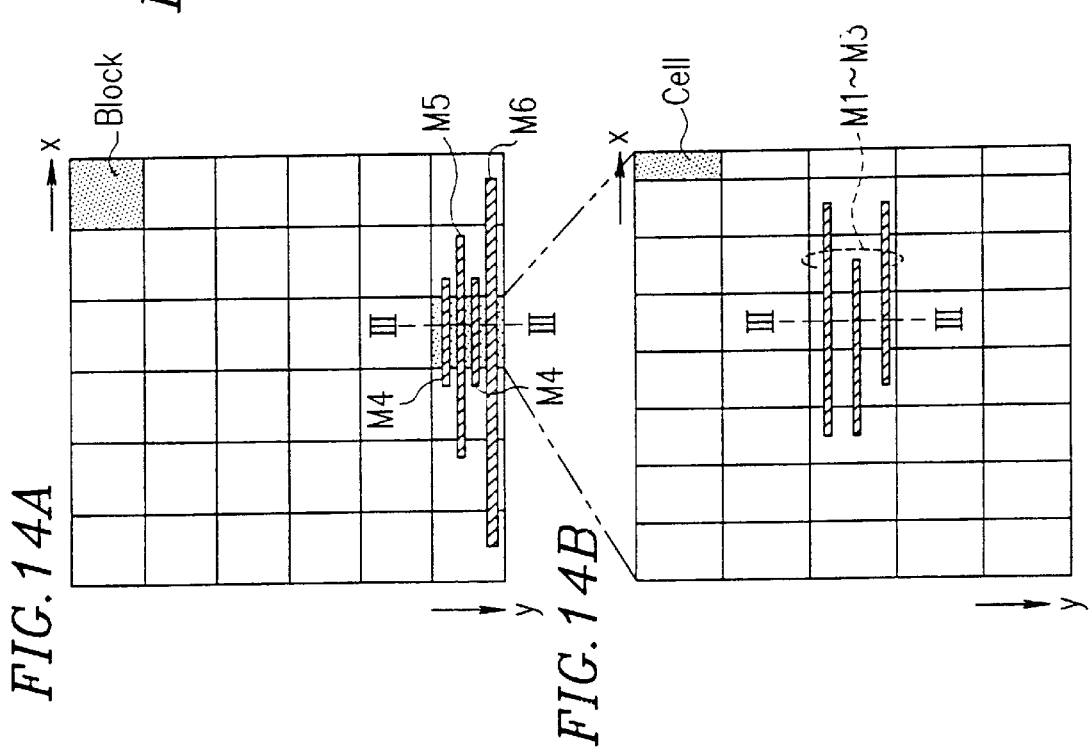

*FIG.15A-1* *FIG.15A-2*
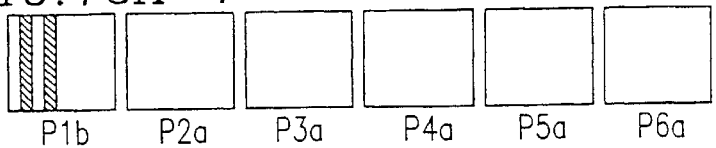
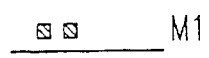
*FIG.15B-1* *FIG.15B-2*
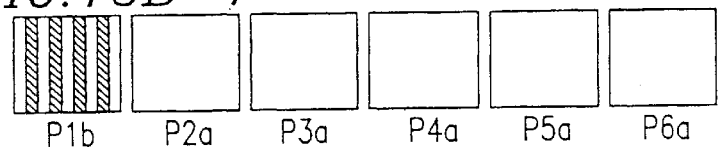
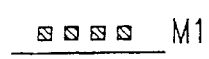
*FIG.15C-1* *FIG.15C-2*
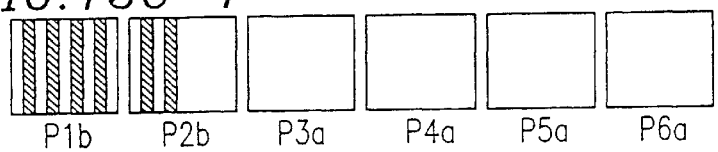
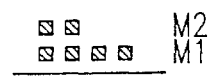
*FIG.15D-1* *FIG.15D-2*
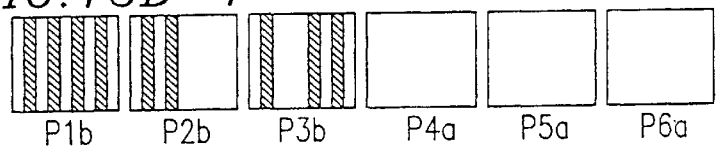
*FIG.15E-1* *FIG.15E-2*
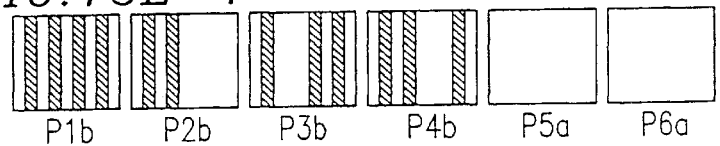
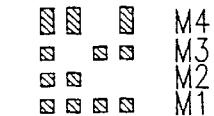
*FIG.15F-1* *FIG.15F-2*
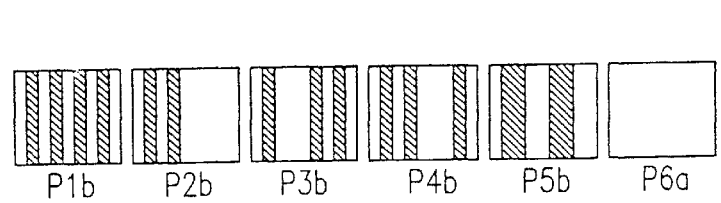
*FIG.15G-1* *FIG.15G-2*
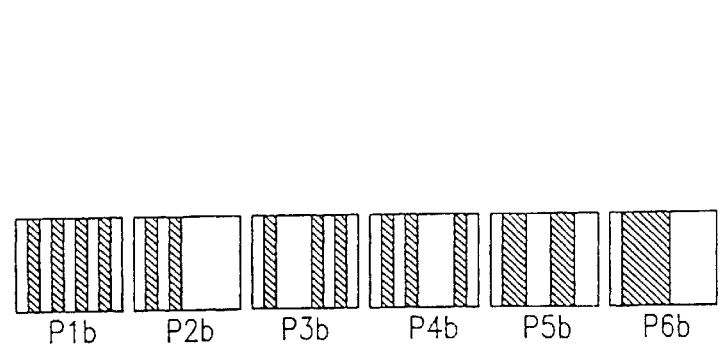
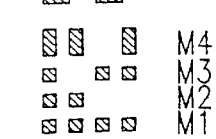

METHOD FOR DESIGNING LSI CIRCUIT PATTERN

BACKGROUND OF THE INVENTION

1. Field of the Invention

The present invention relates to a method for designing an LSI circuit pattern and a method for calculating a gate delay time to be used for designing the LSI circuit pattern.

2. Description of the Related Art

Recently, miniaturization of semiconductors has seen great progress. This progress in turn has caused a serious problem of an increased interconnect delay. In order to overcome this problem, the following new technologies are indispensable: (1) new materials such as Cu interconnect, low dielectric materials, etc.; (2) new circuit technologies such as repeaters, variable pitch routers whose wiring width can be freely altered, and the like; and (3) a configuration in which a metal width and a metal thickness are made smaller for the wiring shortened by miniaturization, or made larger for the wiring lengthened by miniaturization, both by a size corresponding to the scaling (so-called hierarchical interconnect scheme).

Examples for such conventional technologies as (1), (2), and (3), can be found respectively in: "IEEE 1993 IEDM Technical Digest, pp. 261–264"; IEEE 1985 Trans. On Electron Devices, vol. ED-32 (1985), pp. 903–909"; and "IEEE 1995 Proceedings of IEEE, pp. 20–36".

Methods for determining an interconnect design rule and the number of metal layers using the above conventional technologies (1), (2), and (3) are disclosed in, for example, "IEEE 1995 IEDM Technical Digest, pp. 241–244" and "IEEE 1995 IEDM Technical Digest, pp. 245–249".

An example will be given below for each of the above conventional methods for determining an interconnect design rule and the number of metal layers.

First, the method for determining an interconnect design rule will be described.

In the conventional determining method, a wiring pattern is divided into two groups, that is, a wiring pattern of local interconnects (i.e., an interconnect which connects together cells included in a logic circuit block within the logic circuit block) and a wiring pattern of global interconnects (i.e., an interconnect which connects the logic circuit blocks together). Such a grouping of the wiring pattern is characteristic of this determining method.

In the wiring pattern of local interconnects, an interconnect delay presents no problem, and accordingly, a value based on a load map of the SIA (Semiconductor Industry Association) is basically adopted as the design rule. On the other hand, in the wiring pattern of global interconnects, the maximum interconnect length is assumed to be the length of a chip, and the metal pitch and the metal thickness are adjusted so that the interconnect delay in this case is equivalent to an inverse of a clock frequency.

Next, the method for determining the number of metal layers will be described.

The interconnect delay RC is represented by Formula (1) below:

$$RC = 2 \rho^* \epsilon^* \epsilon_0 (4 L^2/Pave^2 + L^2/T^2) \quad (1)$$

wherein $\rho$ is conductivity of an interconnect material, $\epsilon$ is a relative dielectric constant of an interlayer insulating film, $\epsilon_0$ is a dielectric constant of a vacuum, L is an interconnect length, Pave is an average metal pitch, and T is a metal thickness. The number of metal layers N is represented by Formula (2) below wherein Peff is a minimum metal pitch:

$$N = Pave/Peff \quad (2).$$

By setting the interconnect length L to be the length of a chip, and determining the metal pitch Pave and the metal thickness T so that the interconnect delay RC is equivalent to an inverse of the clock frequency using Formula (1), the number of metal layers N can be determined from Formula (2).

However, the conventional method for designing an LSI circuit pattern in which the interconnect design rule and the number of metal layers are determined as above has the following problems.

The above conventional method for designing an LSI circuit pattern presupposes an interconnect scheme having a relatively small number of metal layers, for example, up to approximately 5 layers in total. The wiring pattern of local interconnects is provided in approximately three layers from the bottom, and the wiring pattern of global interconnects is provided in approximately two layers located on top of the metal layers accommodating the wiring pattern of local interconnects. Thus, in the conventional method, the wiring pattern is divided into two groups, that is, the wiring pattern of local interconnects and the wiring pattern of global interconnects, and a design rule based on the load map of the SIA is used for the wiring pattern of local interconnects without any adjustment. Only for the wiring pattern of global interconnects, the design rule is adjusted by the designing method described above.

However, in LSIs of recent generations, a multilayer interconnect scheme having five layers or more has been demanded in accordance with the increasing complication of the circuit configuration. The conventional method for designing an LSI circuit pattern, in which only the design rule of the wiring pattern of global interconnects is adjusted, cannot cope with designing a circuit pattern in such a multilayer interconnect scheme because the method cannot determine how to set a design rule for an interconnect scheme having five layers or more, or cannot obtain the numbers of metal layers for each of the wiring pattern of local interconnects and the wiring pattern of global interconnects. As a result, an optimal wiring pattern cannot be obtained.

For example, according to the design by the conventional method based on the aforementioned "IEEE 1995 IEDM Technical Digest, pp. 241–244", the number of metal layers is 6, 7, 11, and 15 in the 0.25 $\mu$m, 0.18 $\mu$m, 0.13 $\mu$m, and 0.10 $\mu$m generations respectively, which indicates that the number of metal layers has become impractically large as the generation advances. The above designing calculation has the following conditions: the scaling, the minimum metal pitch Peff, and the interconnect delay RC are set to be 0.7 times as large as those in the immediate previous generation; the chip length is set to be 1.1 times as large as that in the immediate previous generation; the interconnect material is Al for the 0.25 $\mu$m generation, and Cu for the 0.18 $\mu$m and subsequent generations; and the relative dielectric constant of the interlayer insulating film is 3.5 for the 0.25 $\mu$m generation, 3.0 for the 0.18 $\mu$m generation, 2.6 for the 0.13 $\mu$m generation, and 2.2 for the 0.10 $\mu$m generation.

SUMMARY OF THE INVENTION

One aspect of the present invention provides a method for designing an LSI circuit pattern for pattern-designing a plurality of gates and a wiring pattern which connects the plurality of gates on an LSI chip. The method includes: a first step of estimating a chip area of the LSI chip and a number of the plurality of gates required for achieving a desired function; a second step of estimating an interconnect length of each of the plurality of gates; a third step of designing a wiring pattern associated with the each of the plurality of gates based on a prescribed design rule sequentially from a gate having the shortest interconnect length, and calculating a gate delay time for the design wiring pattern; a fourth step of repeating at least one of the second and third steps after altering the design rule in the case where the calculated gate delay time exceeds a prescribed target value, while calculating a total of areas occupied by the designed wiring patterns in the case where the calculated gate delay time is at or below the prescribed target value; and a fifth step of sequentially performing the third and fourth steps for a gate having a next shortest interconnect length in the case where the calculated total of areas occupied by the designed wiring patterns does not exceed the chip area estimated in the first step, while in the case where the calculated total of areas occupied by the designed wiring patterns exceeds the chip area estimated in the first step, adding one new metal layer and sequentially performing the third and fourth steps for the gate having a next shortest interconnect length on the added metal layer.

In one embodiment, the LSI circuit pattern includes a configuration in which a driver gate and a plurality of load gates are connected by a wiring branched in the middle thereof. In the above-mentioned third step, a portion of the wiring extending from the driver gate to a load gate of interest included in the plurality of load gates is set to be a wiring of interest, while a portion of the wiring extending from a wiring branch point on the wiring of interest to a load gate of no interest included in the plurality of load gates is set to be a branch wiring. An actual gate delay time is calculated by correcting a gate delay time obtained in the case where there is no wiring load, using an ON resistance of a transistor included in the driver gate, a total of fan-out capacitances of transistors included in the respective load gates, a wiring capacitance of the branch wiring, a wiring capacitance of the wiring of interest, and a wiring resistance of the wiring of interest.

Preferably, the actual gate delay time $Tpd$ is calculated from a formula below:

$$Tpd = tpd + Rtr \times (Cd + Cw) + Rw \times k1 \times Cf + Rw \times k2 \times Cd + Rw \times k3 \times Cw,$$

wherein
 $tpd$: the gate delay time obtained in the case where there is no wiring load;
 $Rtr$: the ON resistance of a transistor included in the driver gate;
 $Cf$: the total value of fan-out capacitances of transistors included in the respective load gates;
 $Cd$: the wiring capacitance of the branch wiring;
 $Cw$: the wiring capacitance of the wiring of interest;
 $Rw$: wiring resistance of the wiring of interest; and
 $k1$, $k2$ and $k3$: a constant which takes on a value ranging from 0 to 1 inclusive.

Values of the $tpd$, the $Rtr$, the $Cf$, and the $k3$ may be each determined by performing a circuit simulation using the $Cw$ and the $Rw$ as parameters.

In the case where a number of the plurality of load gates is set to be n (n: natural number), the term $Rw \times k1 \times Cf$ included in the above formula may be calculated from formulae below:

$$Rw \times k1 \times Cf = Rw \times (k1_1 \times Cf_1 + k1_2 \times Cf_2 + \ldots + k1_{n-1} \times Cf_{n-1} + k1_n \times Cf_n);$$
and $$k1_1 = L_1/L, \ldots, k1_n = L_n/L,$$

wherein
 $Cf_1$ through $Cf_n$: a fan-out capacitance of each of the plurality of load gates;
 $L_1$ through $L_n$: a wiring distance of the wiring of interest from the driver gate to the wiring branch point respectively corresponding to the plurality of load gates; and
 $L$: a total wiring distance of the wiring of interest.

In the case where a number of the branch wirings is set to be m (m: natural number), the term $Rw \times k2 \times Cd$ included in the above formula may be calculated from formulae below:

$$Rw \times k2 \times Cd = Rw \times (k2_1 \times Cd_1 + k2_2 \times Cd_2 + \ldots + k2_{m-1} \times Cd_{m-1} + k2_m \times Cd_m);$$
and $$k2_1 = k3 \times (D_1/L), \ldots k2_n = k3 \times (D_m/L),$$

wherein
 $Cd_1$ through $Cd_m$: the wiring capacitance of each of the branch wirings;
 $D_1$ through $D_m$: a wiring distance of the wiring of interest from the driver gate to the wiring branch point respectively corresponding to the branch wirings; and
 $L$: a total wiring distance of the wiring of interest.

The method may further include the steps of: increasing a driver size of a driver gate included in the plurality of gates in the case where the gate delay time calculated upon designing the plurality of gate the wiring patterns on the LSI chip exceeds the prescribed target value; inserting a repeater between the driver gate and the load gate included in the plurality of gates in the case where a gate delay time recalculated after the step of increasing a driver size exceeds the prescribed target value; and widening a metal pitch of the wiring pattern in the case where a gate delay time recalculated after the step of inserting a repeater exceeds the prescribed target value.

Upon altering the design rule, a wiring pattern of local interconnects for connecting together cells included in a logic circuit block within the logic circuit block may be pattern-designed through a use of an interconnect having an interconnect structure whose aspect ratio between a metal thickness and a metal width is close to 1; and a wiring pattern of global interconnects for connecting the logic circuit blocks together may be pattern-designed through a use of an interconnect having an interconnect structure whose aspect ratio is close to 2.

The interconnect may be made of copper.

Another aspect of the present invention provides a method for designing an LSI circuit pattern which includes a configuration in which a driver gate and a plurality of load gates are connected by a wiring branched in the middle thereof. A portion of the wiring extending from the driver gate to a load gate of interest included in the plurality of load gates is set to be a wiring of interest, while a portion of the wiring extending from a wiring branch point on the wiring of interest to a load gate of no interest included in the plurality of load gates is set to be a branch wiring. An actual gate delay time is calculated by correcting a gate delay time obtained in the case where there is no wiring load, using an ON resistance of a transistor included in the driver gate, a total of fan-out capacitances of transistors included in the respective load gates, a wiring capacitance of the branch wiring, a wiring capacitance of the wiring of interest, and a wiring resistance of the wiring of interest.

The actual gate delay time Tpd may be calculated from a formula below:

$$Tpd = tpd + Rtr \times (Cd + Cw) + Rw \times k1 \times Cf + Rw \times k2 \times Cd + Rw \times k3 \times Cw,$$

wherein
- tpd: the gate delay time obtained in the case where there is no wiring load;
- Rtr: the ON resistance of a transistor included in the driver gate;
- Cf: the total value of fan-out capacitances of transistors included in the respective load gates;
- Cd: the wiring capacitance of the branch wiring;
- Cw: the wiring capacitance of the wiring of interest;
- Rw: wiring resistance of the wiring of interest; and
- k1, k2 and k3: a constant which takes on a value ranging from 0 to 1 inclusive.

Still another aspect of the present invention provides a method for designing an LSI circuit pattern for pattern-designing a plurality of gates and a wiring pattern which connects the plurality of gates on an LSI chip. The method includes the steps of: increasing a driver size of a driver gate included in the plurality of gates in the case where the gate delay time calculated upon designing the plurality of gate the wiring patterns on the LSI chip exceeds the prescribed target value; inserting a repeater between the driver gate and the load gate included in the plurality of gates in the case where a gate delay time recalculated after the step of increasing a driver size exceeds the prescribed target value; and widening a metal pitch of the wiring pat tern in the case where a gate delay time recalculated after the step of inserting a repeater exceeds the prescribed target value.

Still another aspect of the present invention provides a method for designing an LSI circuit pattern for pattern-designing a plurality of gates and a wiring pattern which connects the plurality of gates on an LSI chip, wherein: a wiring pattern of local interconnects for connecting together cells included in a logic circuit block within the logic circuit block is pattern-designed through a use of an interconnect having an interconnect structure whose aspect ratio between a metal thickness and a metal width is close to 1; and a wiring pattern of global interconnects for connecting the logic circuit blocks together is pattern-designed through a use of an interconnect having an interconnect structure whose aspect ratio is close to 2.

The interconnect may be made of copper.

According to the present invention, an actual gate delay time is calculated by correcting a gate delay time obtained in the case where there is no wiring load, using factors which vary in accordance with a state in which a wiring is provided. Specifically, the factors are the ON resistance of a transistor included in a driver gate, the total value of fan-out capacitances of transistors included in the respective load gates, the wiring capacitance of a branch wiring, the wiring capacitance of a wiring of interest, and the wiring resistance of the wiring of interest. This makes it possible to obtain a highly accurate value of the gate delay time.

Furthermore, according to the method for designing an LSI circuit pattern of the present invention, the operations for restricting the gate delay time (i.e., the operation of increasing a driver size, the operation of inserting repeater (s), and the operation of increasing a metal pitch) are respectively assigned different priorities based on an increase in the area of the LSI chip and the number of metal layers resulting from the implementation of each operation. The operation to be implemented is selected according to these priorities. This makes it possible to restrict an increase in the area of the LSI chip and the number of metal layers.

Moreover, according to the method for designing an LSI circuit pattern of the present invention, an optimal number of metal layers in accordance with the number of gates can be obtained by performing a circuit designing in each metal layer with an optimal design rule.

Additionally, according to the method for designing an LSI circuit pattern of the present invention, it is possible to design a wiring pattern in accordance with an aspect ratio between the metal thickness and the metal width. This makes it possible to further restrict an increase in the area of the LSI chip and the number of metal layers.

Thus, the invention described herein makes possible the advantages of (1) providing a method for designing an LSI circuit pattern which makes possible a high-precision design even if the LSI circuit pattern has a multilayer interconnect scheme, and (2) providing a method for calculating with a high precision a gate delay time for a gate included in the LSI circuit pattern which can be employed in such designing of the LSI circuit pattern.

These and other advantages of the present invention will become apparent to those skilled in the art upon reading and understanding the following detailed description with reference to the accompanying figures.

BRIEF DESCRIPTION OF THE DRAWINGS

FIG. 11A-1 is a circuit diagram illustrating a state of a circuit at one stage of the modification process for a circuit design pattern;

FIG. 11A-2 is a plan view of an actual mask pattern corresponding to FIG. 11A-1;

FIG. 11B-1 is a circuit diagram illustrating a state of the circuit at another stage of the modification process for the circuit design pattern;

FIG. 11B-2 is a plan view of an actual mask pattern corresponding to FIG. 11B-1;

FIG. 11C-1 is a circuit diagram illustrating a state of the circuit at yet another stage of the modification process for the circuit design pattern;

FIG. 11C-2 is a plan view of an actual mask pattern corresponding to FIG. 11C-1;

FIG. 11D-1 is a circuit diagram illustrating a state of the circuit at still another stage of the modification process for the circuit design pattern;

FIG. 11D-2 is a plan view of an actual mask pattern corresponding to FIG. 11D-1;

FIG. 14A is a plan view schematically illustrating a top image of a chip in which a plurality of blocks are arranged in an array on an X-Y plane;

FIG. 14B is an enlarged plan view of one block in the array shown in FIG. 14A;

FIG. 14C is a cross-sectional view schematically illustrating a layered state of the wirings M1 through M6 included in the configurations shown in FIGS. 14A and 14B;

FIG. 15A-1 is a plan view illustrating part of a flat mask in a first step of setting a design rule according to the present invention;

FIG. 15A-2 is a cross-sectional view of a wiring configuration corresponding to FIG. 15A-1;

FIG. 15B-1 is a plan view illustrating part of a flat mask in a second step of setting a design rule according to the present invention;

FIG. 15B-2 is a cross-sectional view of a wiring configuration corresponding to FIG. 15B-1;

FIG. 15C-1 is a plan view illustrating part of a flat mask in a third step of setting a design rule according to the present invention;

FIG. 15C-2 is a cross-sectional view of a wiring configuration corresponding to FIG. 15C-1;

FIG. 15D-1 is a plan view illustrating part of a flat mask in a fourth step of setting a design rule according to the present invention;

FIG. 15D-2 is a cross-sectional view of a wiring configuration corresponding to FIG. 15D-1;

FIG. 15E-1 is a plan view illustrating part of a flat mask in a fifth step of setting a design rule according to the present invention;

FIG. 15E-2 is a cross-sectional view of a wiring configuration corresponding to FIG. 15E-1;

FIG. 15F-1 is a plan view illustrating part of a flat mask in a sixth step of setting a design rule according to the present invention;

FIG. 15F-2 is a cross-sectional view of a wiring configuration corresponding to FIG. 15F-1;

FIG. 15G-1 is a plan view illustrating part of a flat mask in a seventh step of setting a design rule according to the present invention; and FIG. 15G-2 is a cross-sectional view of a wiring configuration corresponding to FIG. 15G-1.

DESCRIPTION OF THE PREFERRED EMBODIMENTS

The present invention will be described below by way of illustrative examples with reference to the accompanying drawings.

Figure 1:
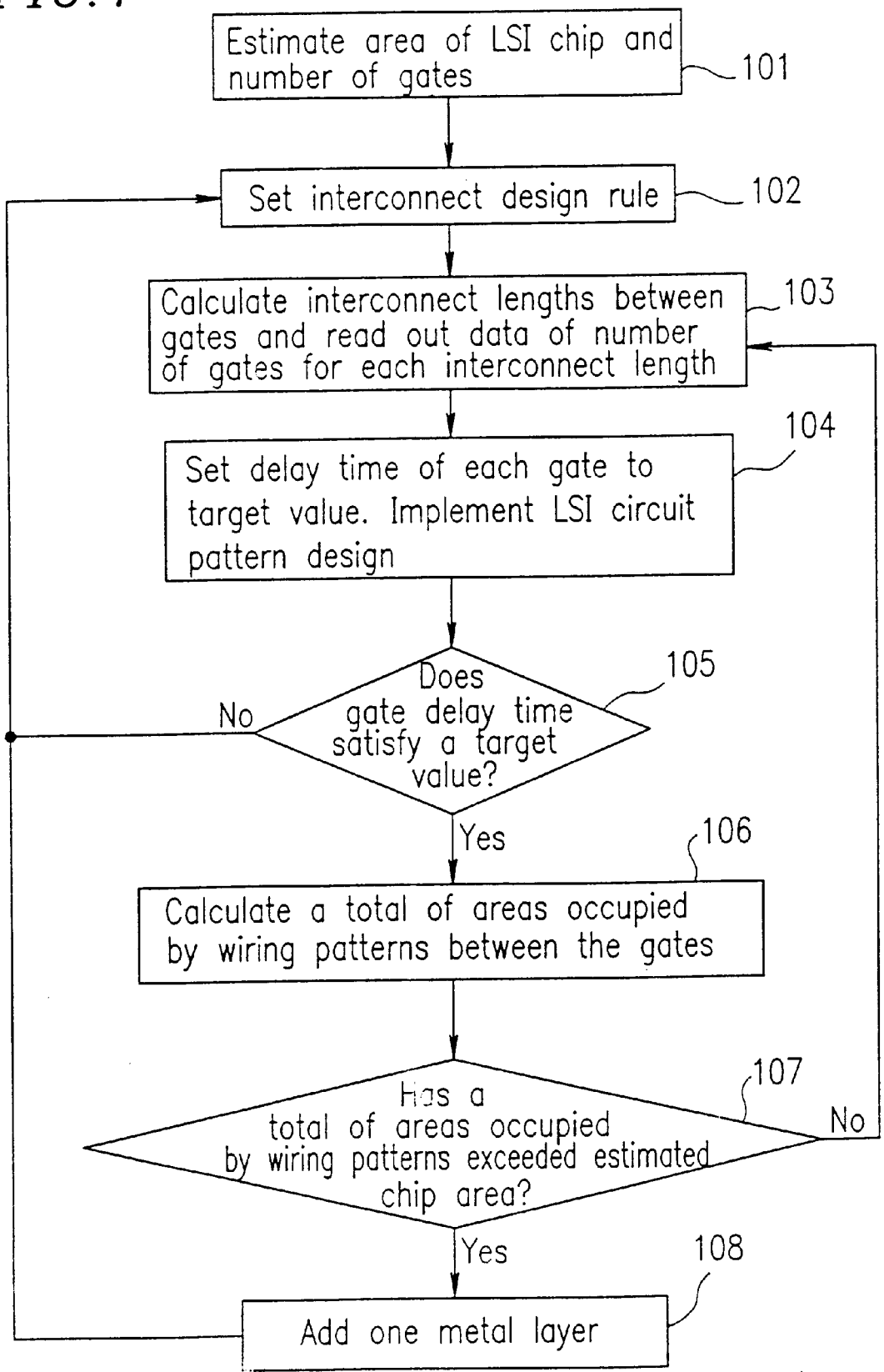
FIG. 1 is a flowchart illustrating a method for designing an LSI circuit pattern according to one example of the present invention.

FIG. 1 is a flowchart of a method for designing an LSI circuit pattern (including methods for determining an interconnect design rule and the number of metal layers) according to one example of the present invention.

In the method shown in FIG. 1, an area of an LSI chip and the number of gates to be included therein are first estimated according to a technology trend in step 101. For example, in the case where the 0.13 $\mu$m generation is chosen as a technological condition, the area of the LSI chip is estimated to be 430 MM2, and the number of gates is estimated to be 10 million.

Next, in step 102, a design rule for an interconnect is set according to the technology trend. Exemplary technological conditions for step 102 are as follows: 0.13 $\mu$m generation; a metal thickness of 0.37 $\mu$m; an interlayer thickness of 0.61 $\mu$m; and a metal pitch of 0.4 $\mu$m (metal width: 0.2 $\mu$m, metal space: 0.2 $\mu$m).

Thereafter, in step 103, a distribution of interconnect lengths between the gates in the LSI chip is calculated (i.e., estimated). Specifically, in step 103, the calculation of the interconnect length distribution is performed once for each interconnect design rule previously set in step 102, and data of the number of gates for each interconnect length are sequentially read out based on the calculated interconnect length distribution.

Figure 2:
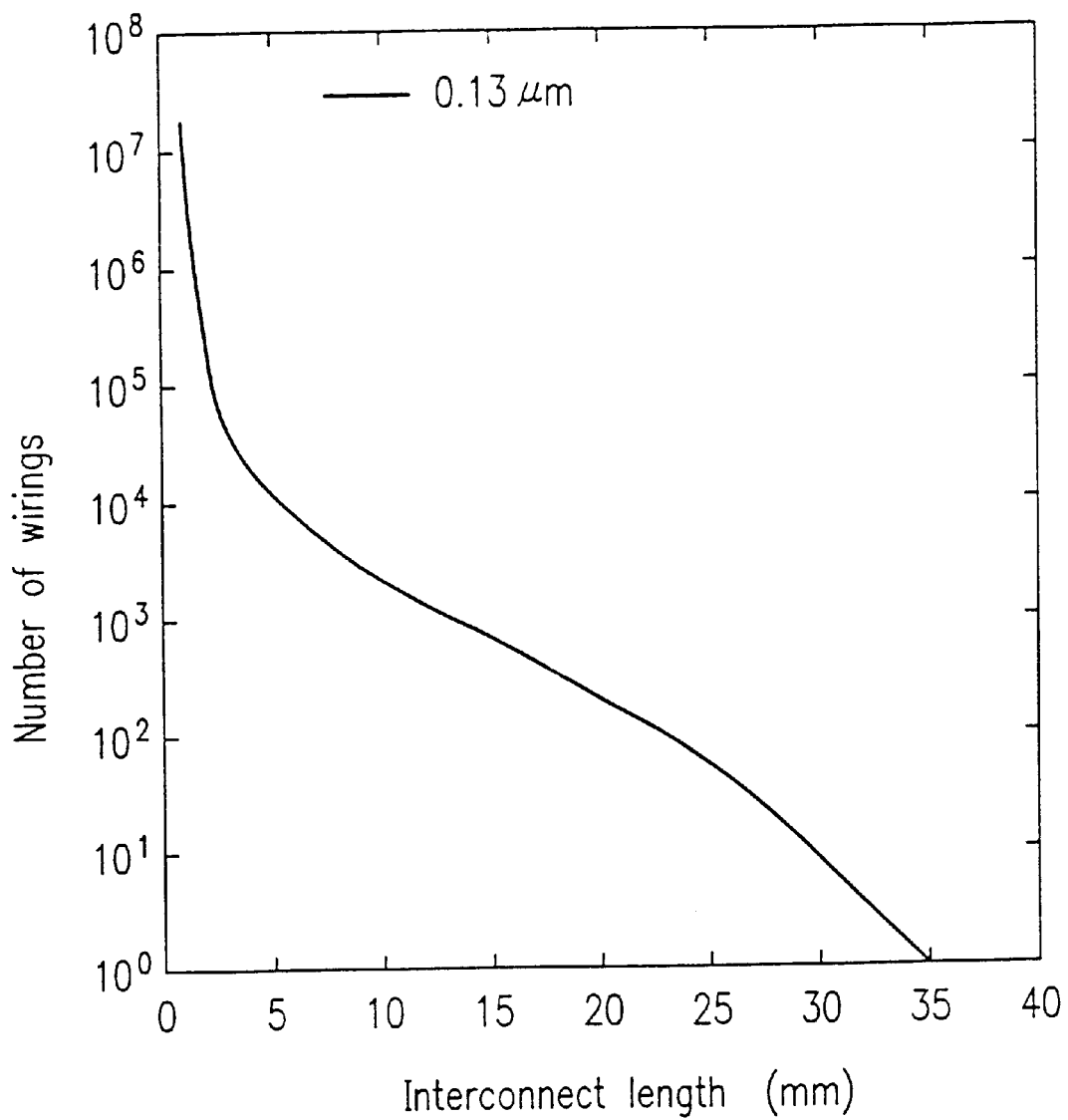
FIG. 2 is a graph illustrating calculation results of an interconnect length distribution.

For the calculation of the interconnect length distribution in step 103, such a method as described in "1996 VLSI Technology Symposium, pp. 241–242" can be used. Briefly speaking, this method calculates the interconnect length distribution by means of a stochastic interconnect length distribution model of a random logic network based on Rent's Law. FIG. 2 shows an exemplary result of a calculation of the interconnect length distribution according to this method. As is clear from FIG. 2, the number of gates having a short interconnect length is very large while the number of gates having a long interconnect length is very small. In particular, the number of gates having an interconnect length exceeding the length of the chip is extremely small.

After calculating the distribution of interconnect lengths between the gates in the LSI chip in step 103, the designing of a wiring pattern in connection with the respective gates is performed sequentially from a gate having a short interconnect length in step 104. Specifically, the wiring pattern for the driver gate having the shortest interconnect length is designed first, and the gate delay time Tpd for the designed wiring pattern is calculated. Then, in step 105, it is determined whether or not the calculated gate delay time Tpd satisfies a target value. In the case where it is determined that the target value is not satisfied (i.e., exceeded), the routine returns to step 102, where the interconnect design rule is reset. In the resetting operation in step 102, at least one of the metal width, the metal space, the metal thickness, and the interlayer thickness is designed to be larger.

The designing of the wiring pattern is performed by repeating the above operations (i.e., steps 102 through 105). When it is confirmed in step 105 in the middle of this designing process that the gate delay time of the wiring pattern of the driver gate having the shortest interconnect length satisfies (i.e., is equal to or smaller than) the target value, the routine proceeds to step 106.

In step 106, a total of the areas occupied by the wirings in the designed wiring patterns is calculated. The summation is performed by calculating a product of the metal pitch, the interconnect length, the number of gates for the interconnect length, and the wiring efficiency (i.e., metal pitch× interconnect length×no. of gates×wiring efficiency) for each designed wiring pattern, and adding up the product for all of the designed wiring patterns. A typical value of the above wiring efficiency is approximately 0.4.

Next, in step 107, the obtained total of the areas occupied by the wiring patterns is compared with the estimated area of the LSI chip. In the case where it is determined that the total does not exceed the estimated area of the chip, the routine returns to step 103, and performs the reading out of the data of the gate having the next shortest (e.g., second shortest) interconnect length. Then, the designing of the wiring pattern and the comparison of the gate delay time with the target value for the read-out gate are similarly carried out in steps 104 and 105 respectively, thereby determining the wiring pattern of this gate.

After determining the wiring pattern of the second shortest gate, the total of the areas occupied by the designed wiring patterns of the gates (i.e., the gate having the shortest interconnect length and the gate having the second shortest interconnect length) is calculated (step 106), and the obtained total is compared with the estimated area of the LSI chip (step 107). In the case where it is determined that the obtained total does not exceed the estimated area of the chip, the routine returns to step 103, and performs the above-described steps 103 through 107 sequentially for the gates having the next shortest (i.e., third shortest and thereafter) interconnect lengths. This process is repeated until the total of the areas occupied by the designed wiring patterns is determined to have exceeded the estimated area of the chip in step 107.

By repeating the above process, the designing of the wiring patterns of the gates is performed for each interconnect length, sequentially from the gate having a shorter interconnect length.

When it is determined in step 107 that the total of the areas occupied by the designed wiring patterns has exceeded the estimated area of the LSI chip, one metal layer is added in step 108. Then, the routine returns to step 102, where the interconnect design rule is reset. Thereafter, steps 103 through 107 are performed again for the added metal layer, and the designing of the wiring patterns for yet-to-be-designed gates is performed, sequentially from a gate having a shorter interconnect length.

The wiring patterns of all of the gates are designed by repeating the above process (i.e., steps 102 through 108) until the designing of the wiring patterns for the entire interconnect length distribution calculated in step 103 has been completed.

In the above-described flowchart shown in FIG. 1, in the case where it is determined in step 105 that a value of the calculated gate delay time exceeds the prescribed target value, the resetting of the interconnect design rule in step 102 is immediately performed. Alternatively, it is possible to perform a process of modifying the wiring pattern designed in step 104, in the case where it is determined that a value of the calculated gate delay time exceeds the prescribed target value in step 105.

Figure 3:
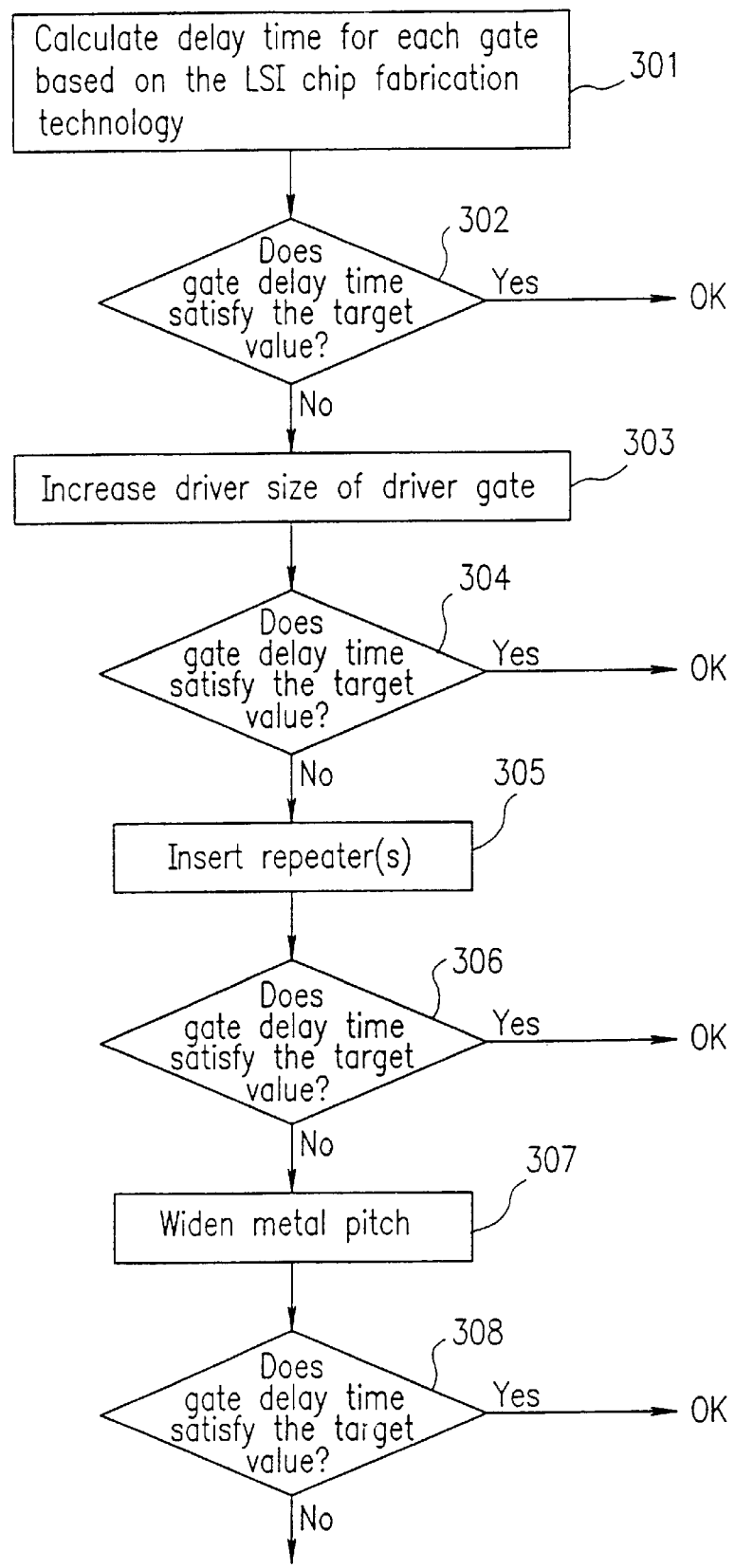
FIG. 3 is a flowchart illustrating a process of modifying a design pattern in the method for designing an LSI circuit pattern according to the present invention.

Described below with reference to a flowchart shown in FIG. 3, is a process of modifying the wiring pattern which is performed in order to keep the gate delay time within a desired range of target values.

First, in step 301, a delay time for each gate is calculated based on the LSI chip fabrication technology, using Formula (3) below:

$$Tpd = tpd + Rtr \times (Cd + Cw) + Rw \times k1 \times Cf + Rw \times k2 \times Cd + Rw \times k3 \times Cw \quad (3),$$

wherein

Tpd: gate delay time;

tpd: gate delay time in the case where there is no wiring load;

Rtr: ON resistance of a transistor included in a driver gate;

Cf: a total value of fan-out capacitances of transistors included in the respective load gates;

Cd: wiring capacitance of branch wiring;

Cw: wiring capacitance of wiring of interest; and

Rw: wiring resistance of wiring of interest.

It should be noted that k1, k2 and k3 are each a constant which takes on a value ranging from 0 to 1 inclusive. In addition, a value of Rtr is inversely proportional to a value of a gate width of the transistor, while a value of Cf is proportional to the value of the gate width of the transistor. Furthermore, values of Cd, Cw, and Rw are respectively proportional to an interconnect length of the associated interconnect.

The above-mentioned wiring of interest and branch wirings will now be described with reference to a schematic circuit configuration shown in FIG. 4.

Figure 4:
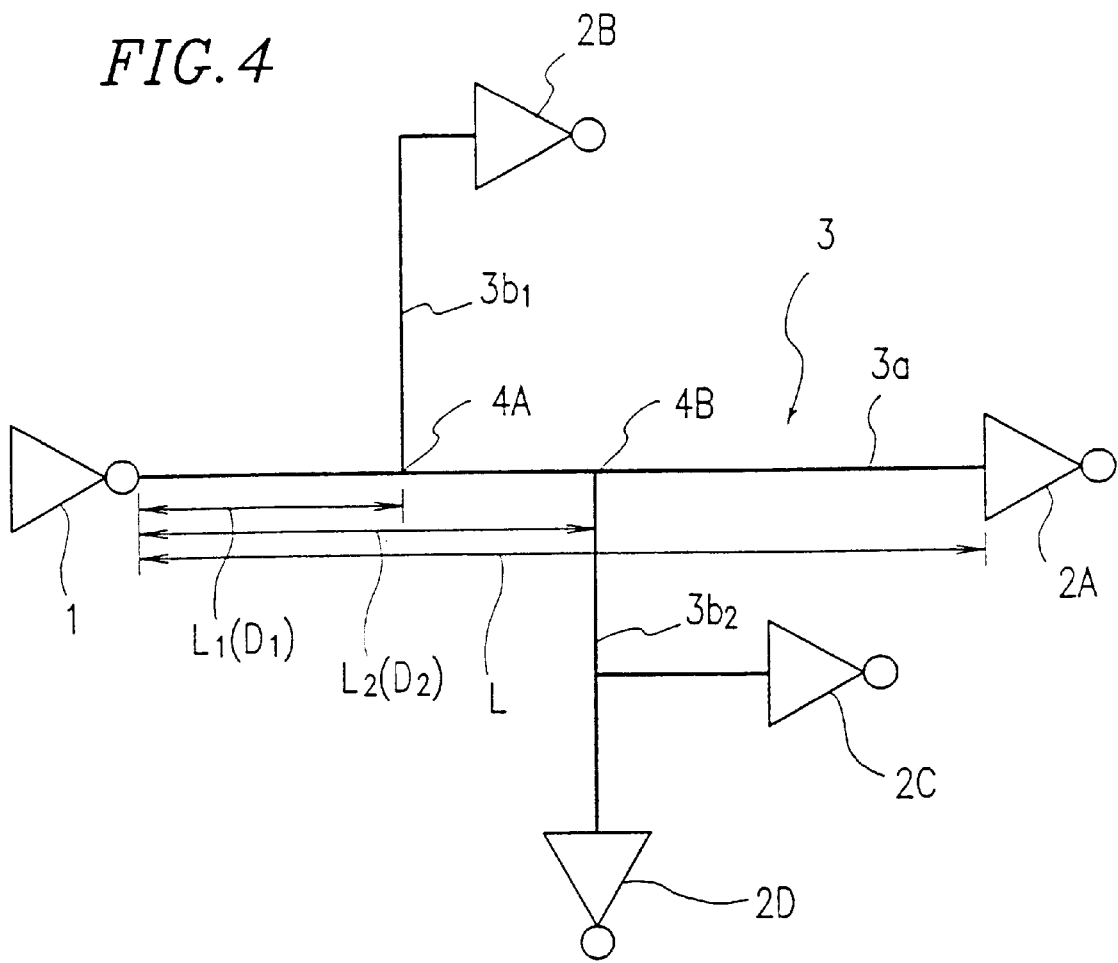
FIG. 4 is a schematic circuit diagram illustrating a wiring of interest and branch wirings to be used in the method for designing an LSI circuit pattern according to the present invention.

In FIG. 4, a driver gate 1 is connected to a plurality of (four in this example) load gates 2A, 2B, 2C, and 2D via wiring 3. In this circuit configuration, the load gate 2A is set to be a "load gate of interest". The wiring extending from the driver gate 1 to the load gate of interest 2A is referred to as a "wiring of interest" 3a. The wiring branching from a wiring branch point 4A on the wiring of interest 3a and reaching the load gate 2B is referred to as a "branch wiring" $3b_1$. The wiring branching from a wiring branch point 4B and reaching the load gates 2C and 2D is referred to as a "branch wiring" $3b_2$. The load gates other than the load gate of interest 2A, i.e., 2B, 2C, and 2D may henceforth be referred to as "load gates of no interest". The branch wiring $3b_2$ branching from the wiring branch point 4B further branches into two wirings which are connected to the load gates 2C and 2D, respectively. Thus, the branch wiring $3b_2$ concurrently serves as a branch wiring which extends from the wiring branch point 4B to the load gate 2C and a branch wiring which extends from the wiring branch point 4B to the load gate 2D.

The parameters tpd, Rtr, and Cf in Formula (3) above are each a constant derived from the LSI chip fabrication technology. Principles of calculating these parameters will now be described. For the sake of simplification, the description will be based on the case where the fan-out of the driver gate 1 is 1, that is, where the wiring capacitance of the branch wiring Cd is 0, and k1=1. This is because values of these parameters (i.e., tpd, Rtr, and Cf) are respectively constant, irrespective of values of Cd, Cw, and Rw.

Figure 5:
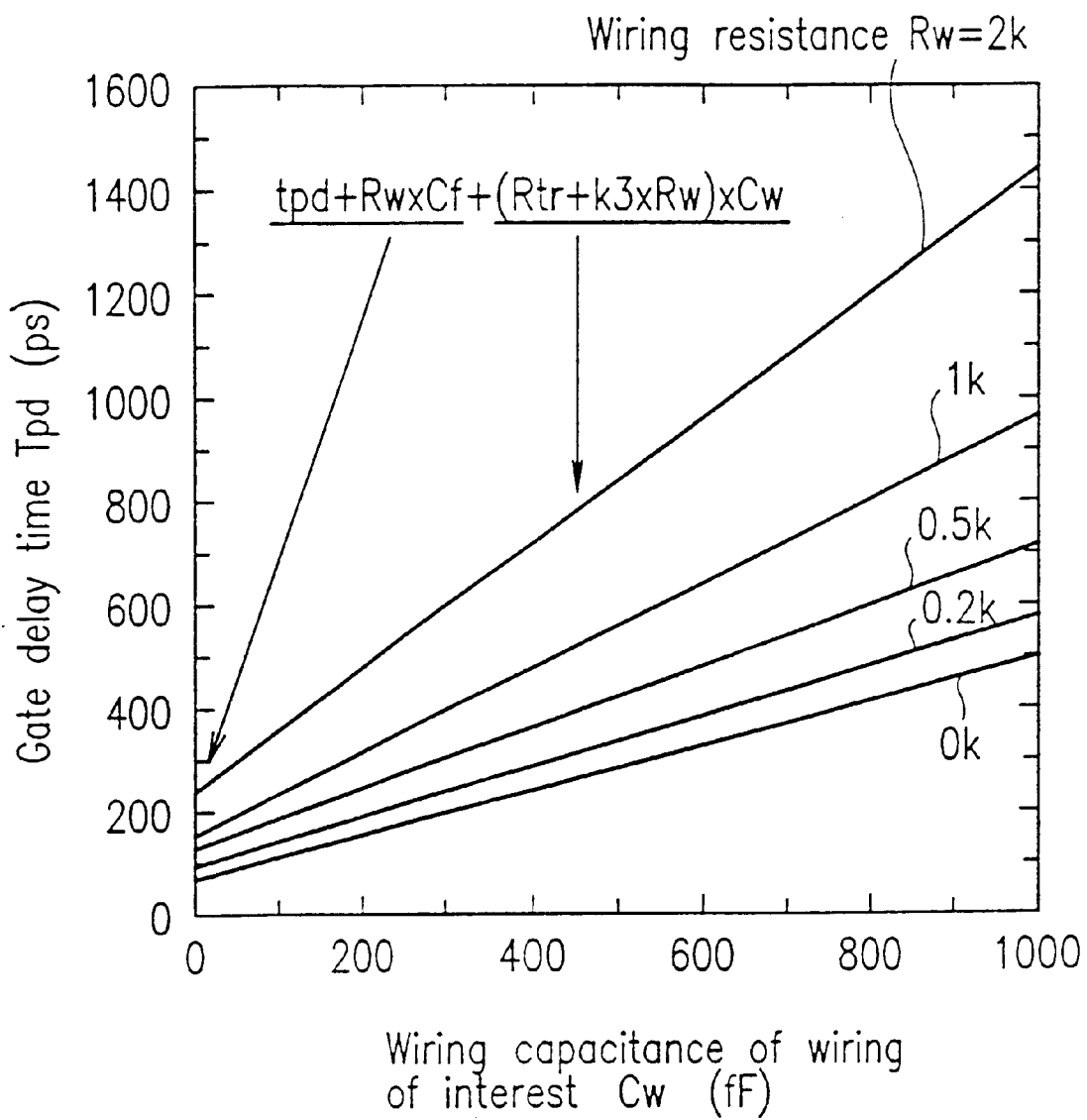
FIG. 5 is a graph illustrating calculation results of a gate delay time obtained from circuit simulations where values of the wiring capacitance Cw and the wiring resistance Rw of the wiring of interest are varied.

FIG. 5 shows calculation results of the gate delay time Tpd obtained from circuit simulations where values of the wiring capacitance Cw and the wiring resistance Rw of the wiring of interest 3a are varied. The X axis of the graph represents the wiring capacitance Cw and the Y axis represents the gate delay time Tpd with the wiring resistance Rw as a parameter. The SPICE (Simulation Program with Integrated Circuit Emphasis) parameters used for the circuit simulations are derived from the LSI chip fabrication technology. The 0.35 μm CMOS generation is chosen to be a technological condition for the simulations.

Conversion of Formula (3) based on the above conditions (i.e., Cd=0, k1=1) results in formula (4) below:

$$Tpd = tpd + Rw \times Cf + (Rtr + k3 \times Rw) \times Cw \quad (4).$$

As known from Formula (4), the gate delay time Tpd is a sum of the terms of Formulae (5) and (6) below:

$$tpd + Rw \times Cf \quad (5)$$

$$(Rtr + k3 \times Rw) \times Cw \quad (6).$$

The term of Formula (5) is independent of the wiring capacitance Cw of the wiring of interest $3a$, and corresponds to the points of intersection of the straight lines and the Y axis (i.e., Y intercepts) in the graph shown in FIG. 5. On the other hand, the term of Formula (6) is in proportion to the wiring capacitance Cw of the wiring of interest $3a$, and (Rtr+k3×Rw) in the term of Formula (6) corresponds to the slopes of the straight lines in FIG. 5.

Figure 6:
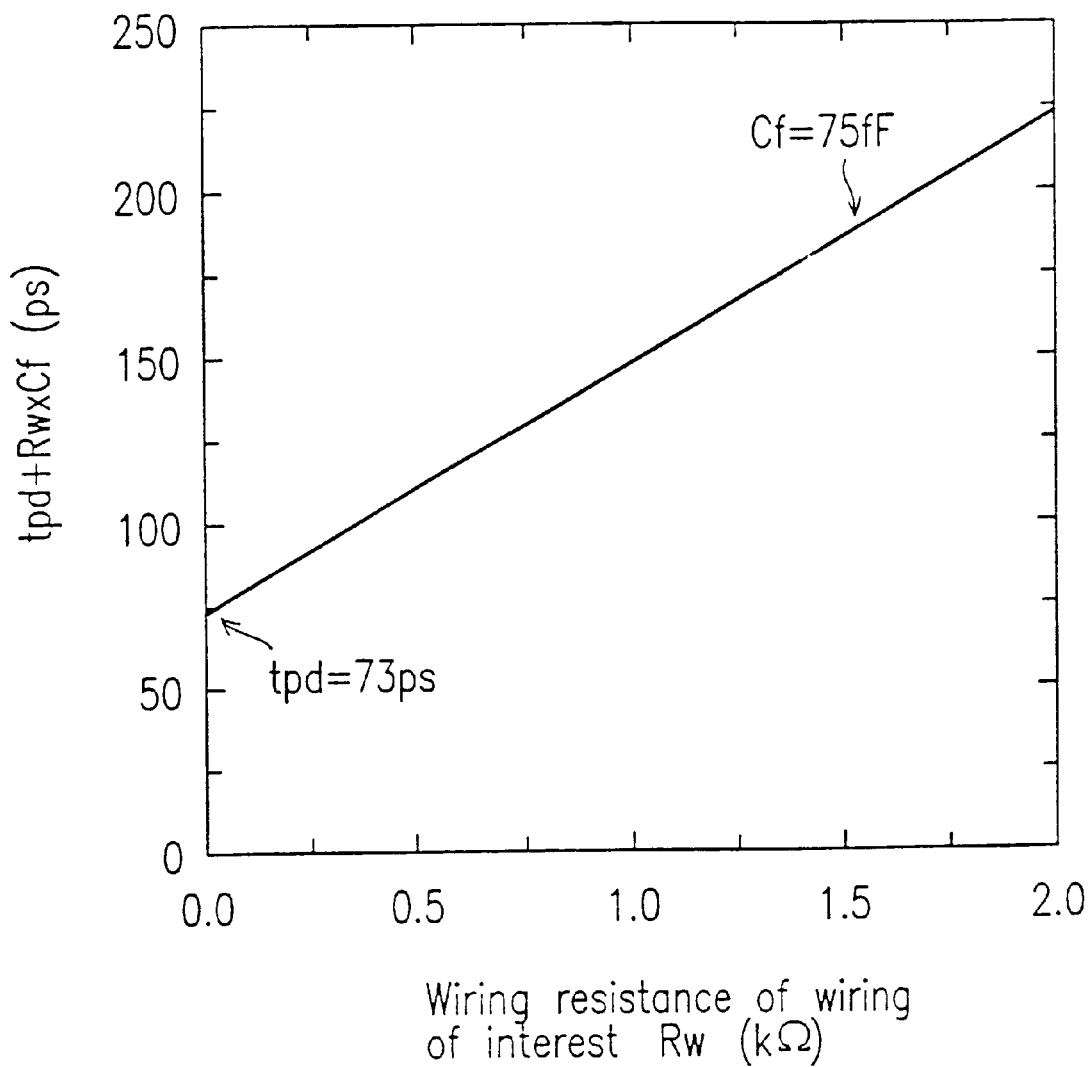
FIG. 6 is a graph relating to FIG. 5 and illustrating a relationship between the wiring resistance Rw of the wiring of interest and a certain parameter.
Figure 7:
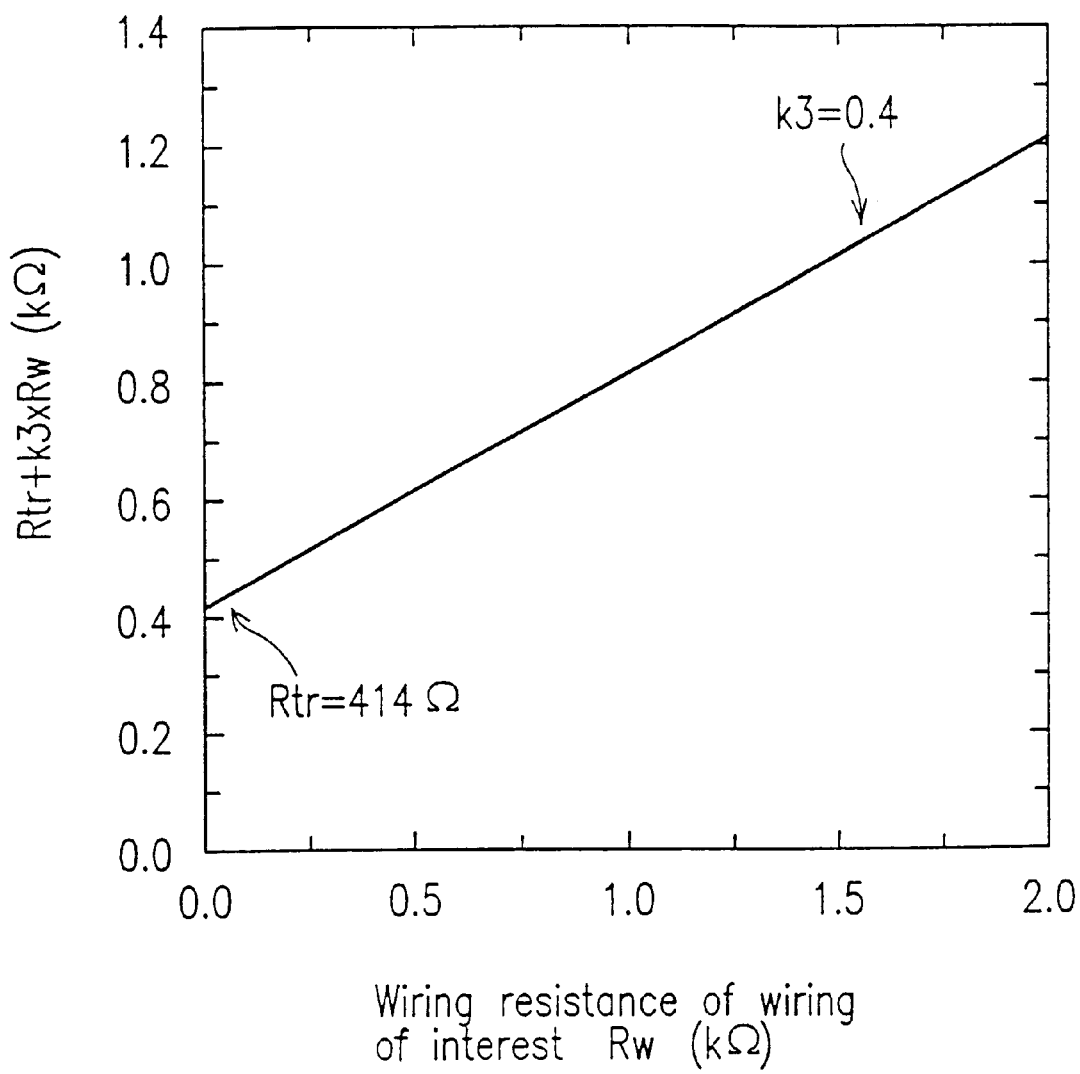
FIG. 7 is a graph relating to FIG. 5 and illustrating a relationship between the wiring resistance Rw of the wiring of interest and another parameter.

FIG. 6 shows the relationship between the term of Formula (5) above (i.e., tpd+Rw×Cf; represented by the Y axis) and the wiring resistance Rw of the wiring of interest $3a$ (represented by the X axis). FIG. 7 shows the relationship between a value of (Rtr+k3×Rw) included in the term of Formula (6) above (represented by the Y axis) and the wiring resistance Rw of the wiring of interest $3a$ (represented by the X axis).

In FIG. 6, the Y intercept of the straight line corresponds to the delay time tpd of the driver gate 1 in the case where there is no wiring load, and the slope of the straight line corresponds to a value of the fan-out capacitance Cf of a transistor included in a load gate. In FIG. 7, the Y intercept of the straight line corresponds to the ON resistance Rtr of the transistor included in the driver gate 1, and the slope of the straight line corresponds to the constant k3.

As described above, by performing circuit simulations using various values of the wiring capacitance Cw and the wiring resistance Rw of the wiring of interest $3a$ based on the LSI chip fabrication technology, the gate delay time tpd in the case where there is no wiring load, the ON resistance Rtr of the transistor included in the driver gate 1, the value of the fan-out capacitance Cf of the transistor included in the load gate, and the constant k3 are determined.

A "total value of the fan-out capacitances Cf of the transistors included in the respective load gates" in the case where a plurality of load gates are provided as in the case of a circuit configuration shown in FIG. 4 will be described in detail.

The term (Rw×k1×Cf) in Formula (3) above can be calculated from Formulae (7) and (8) below:

$$Rw \times k1 \times Cf = Rw \times (k1_1 \times Cf_1 + k1_2 \times Cf_2 + \ldots + k1_{n-1} \times Cf_{n-1} + k1_n \times Cf_n) \quad (7)$$

$$k1_1 = L_1/L, \ldots, k1_n = /L \quad (8)$$

wherein $Cf_1$ through $Cf_n$ are each a fan-out capacitance of each load gate, $L_1$ through $L_n$ are each a wiring distance of the wiring of interest from the driver gate to the wiring branch point respectively corresponding to the load gate, and L is a total wiring distance of the wiring of interest.

The parameters in Formulae (7) and (8) will be specifically described below using the circuit configuration shown in FIG. 4 as an example.

In the circuit configuration shown in FIG. 4, the parameters defined respectively by the load gate of interest, the load gates of no interest, the wiring branch points respectively corresponding to the load gates of no interest, and the positions of these wiring branch points are as follows:

(a) the load gate 2A is a load gate of interest, the load gates 2B, 2C, and 2D are load gates of no interest, and the fan-out capacitances of the load gates 2A, 2B, 2C, and 2D are respectively represented by $Cf_1$, $Cf_2$, $Cf_3$, and $Cf_4$;

(b) two wiring branch points 4A and 4B are provided on the wiring 3, the wiring branch point 4A corresponding to the load gate 2B, and the wiring branch point 4B corresponding to the load gates 2C and 2D;

(c) the wiring distance of the wiring of interest $3a$ from the driver gate 1 to the wiring branch point 4A corresponding to the load gate of no interest 2B is represented by $L_1$ in FIG. 4;

(d) the wiring distance of the wiring of interest $3a$ from the driver gate 1 to the wiring branch point 4B corresponding to the load gate of no interest 2C is represented by $L_2$ in FIG. 4;

(e) the wiring distance of the wiring of interest $3a$ from the driver gate 1 to the wiring branch point 4B corresponding to the load gate of no interest 2D is represented by $L_2$ in FIG. 4;

(f) the total wiring distance of the wiring of interest $3a$ is represented by L in FIG. 4;

(g) the wiring distance of the wiring of interest $3a$ from the driver gate 1 to the wiring branch point 4A of the branch wiring $3b_1$ is represented by $D_1$ (=$L_1$) in FIG. 4;

(h) the wiring distance of the wiring of interest $3a$ from the driver gate 1 to the wiring branch point 4B of the branch wiring $3b_2$ is represented by $D_2$ (=$L_2$) in FIG. 4;

(i) the wiring capacitance of the branch wiring $3b_1$ is represented by $Cd_1$; and (j) the wiring capacitance of the branch wiring $3b_2$ is represented by $Cd_2$.

Under the above parameter conditions, the constant $k1_1$ corresponding to the load gate of interest 2A is calculated from Formula (9) below:

$$k1_1 = L/L = 1 \quad (9),$$

and the constant $k1_2$ corresponding to the load gate of no interest 2B is calculated from Formula (10) below:

$$k1_2 = L_1/L \quad (10).$$

Similarly, the constants $k1_3$ and $k_4$ corresponding respectively to the load gates of no interest 2C and 2D are both calculated from Formula (11) below:

$$k1_3 = k1_4 = L_2/L \quad (11).$$

Therefore, the value of Rw×k1×Cf in the circuit configuration shown in FIG. 4 is determined by Formula (12) below:

$$Rw \times k1 \times Cf = Rw \times \{Cf_1 + (L_1/L) \times Cf_2 + (L_2/L) \times Cf_3 + (L_2/L) \times Cf_4\} \quad (12).$$

Furthermore, under the above parameter conditions, the constant $k2_1$ corresponding to the branch wiring $3b_1$ is calculated from Formula (13) below:

$$k2_1 = k3 \times (D_1/L) \quad (13).$$

Similarly, the constant $k2_2$ corresponding to the branch wiring $3b_2$ is calculated from Formula (14) below:

$$k2_2 = k3 \times (D_2/L) \quad (14).$$

Therefore, the value of Rw×k2×Cd in the circuit configuration shown in FIG. 4 is determined by Formula (15) below:

$$Rw \times k2 \times Cd = Rw \times \{k3 \times (D_1/L) \times Cd_1 + k3 \times (D_2/L) \times Cd_2\} \quad (15).$$

In general, the metal layers located above and under the layer including the wiring of interest 3a are orthogonal to the wiring of interest 3a. In the above calculation example, however, a two-dimensional interconnect structure having the least desirable pattern where metal layers are provided on both sides of, above, and under, the wiring of interest 3a, is contemplated. With such a wiring pattern, even in the case where the metal space in the metal layers above and under the wiring of interest 3a is significantly wide, these metal layers function as ground planes for the wiring capacitance Cw of the wiring of interest 3a. Therefore, wiring capacitance Cw of the wiring of interest 3a will be obtained simply by contemplating the two-dimensional structure.

A value per unit length of the wiring capacitance Cw of the wiring of interest 3a is the same when the interconnects have similar cross-sectional structures. Accordingly, in the actual calculation, the wiring capacitance Cw is determined by interpolating a table of the wiring capacitance per unit length and then multiplying the interpolated value by a value of the interconnect length. In this case, there are four parameters for the interconnect structure, namely, the metal width, the metal space, the metal thickness and the interlayer thickness. However, dividing the above four parameters by the interlayer thickness to normalize the parameters decreases the number of the parameters from four to three, which results in a three-dimensional wiring capacitance table. The wiring capacitances $Cd_1$ and $Cd_2$ can also be calculated similarly.

In this example, the calculation of the wiring capacitances is performed as above, but in the case where the calculation is carried out using an actual DA tool, the calculation method incorporated in the DA tool employed can be used.

Thus, the gate delay time Tpd is calculated by implementing step 301 described above.

Referring back to FIG. 3, each of the remaining steps will now be described.

In step 302, it is determined whether or not the gate delay time Tpd calculated in step 301 satisfies a target value. In the case where the target value is satisfied, the process is terminated. Otherwise, the routine proceeds to step 303.

In step 303, the operation of increasing the driver size of the driver gate 1 is performed until the gate delay time satisfies the target value (e.g., 15% of the clock frequency). An increase in the driver size of the driver gate 1 leads to a decrease in the ON resistance Rtr of the transistor included in the driver gate 1, thereby decreasing the gate delay time Tpd. A plurality of driver sizes can be provided for the driver gate 1. The driver gate 1 is first set to have the smallest driver size. The driver size of the driver gate 1 thus set can be increased so long as a current density of the interconnect does not exceed the reliability standard in view of electromigration.

After the operation of increasing the driver size of the driver gate 1 is repeated with the above-mentioned reliability criterion in view of electromigration as a limit in step 303, it is determined whether or not the gate delay time Tpd satisfies the target value in step 304. In the case where the target value is satisfied, the process is terminated. Otherwise, the routine proceeds to step 305.

In step 305, a repeater is inserted. The repeater used in this example includes CMOS inverters to be inserted into a wiring between the gates. The CMOS inverter is configured for inverting a signal to output the inverted signal. Accordingly, one repeater includes two CMOS inverters.

Figure 8A:
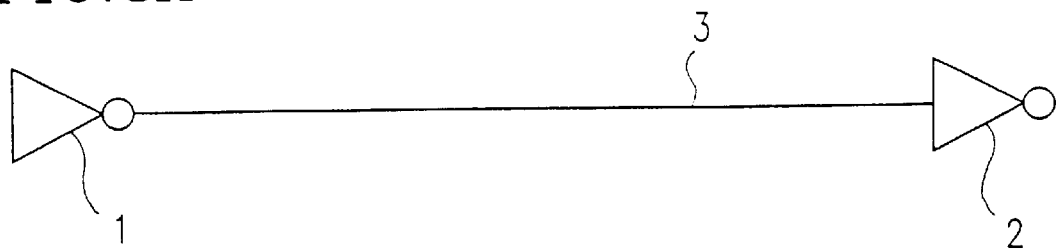
FIG. 8A is a diagram illustrating a circuit configuration before a repeater is inserted.
Figure 8B:
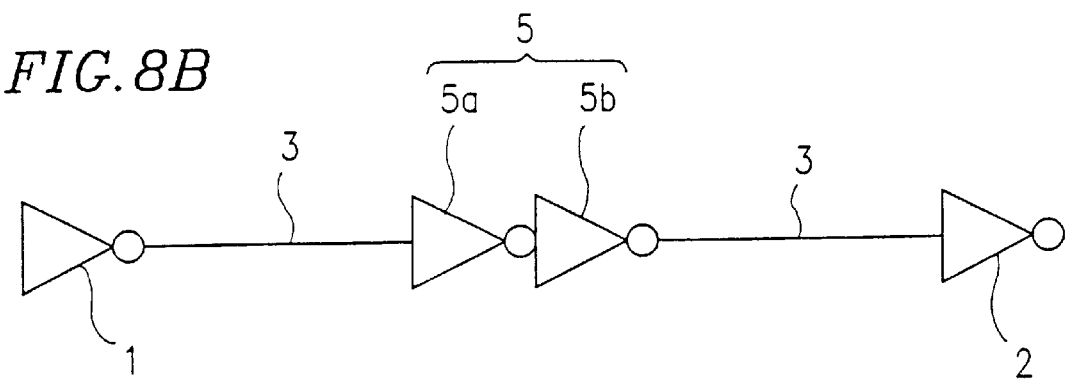
FIG. 8B is a diagram illustrating a circuit configuration after the repeater is inserted.

When inserting n repeaters, each repeater is inserted at one of the positions which divide the intergate distance into 1/(n+1) portions, thereby adjusting (i.e., decreasing) the gate delay time Tpd. The exemplary configuration of the repeater will now be described with reference to FIGS. 8A and 8B. FIG. 8A shows a circuit configuration where repeater is not inserted, and the driver gate 1 and the load gate 2 are connected to each other via the interconnect 3. FIG. 8B shows a circuit configuration where one repeater 5 is inserted into the interconnect 3. In FIG. 8B, reference numeral 5 represents a repeater and reference numerals 5a and 5b each represent CMOS inverters included in the repeater 5.

The principles behind a decrease in the gate delay time Tpd due to an insertion of the repeater will be described below.

When the interconnect length becomes longer, the gate delay is regulated by an interconnect delay (i.e., the term (k3×Rw×Cw) in Formula (4) above). This is because both the wiring resistance Rw and the wiring capacitance Cw are in proportion to the interconnect length, while the interconnect delay is in proportion to the square of the interconnect length. Therefore, dividing the interconnect into 1/(n+1) portions by repeaters reduces the interconnect delay to 1/(n+1).

Figure 9:
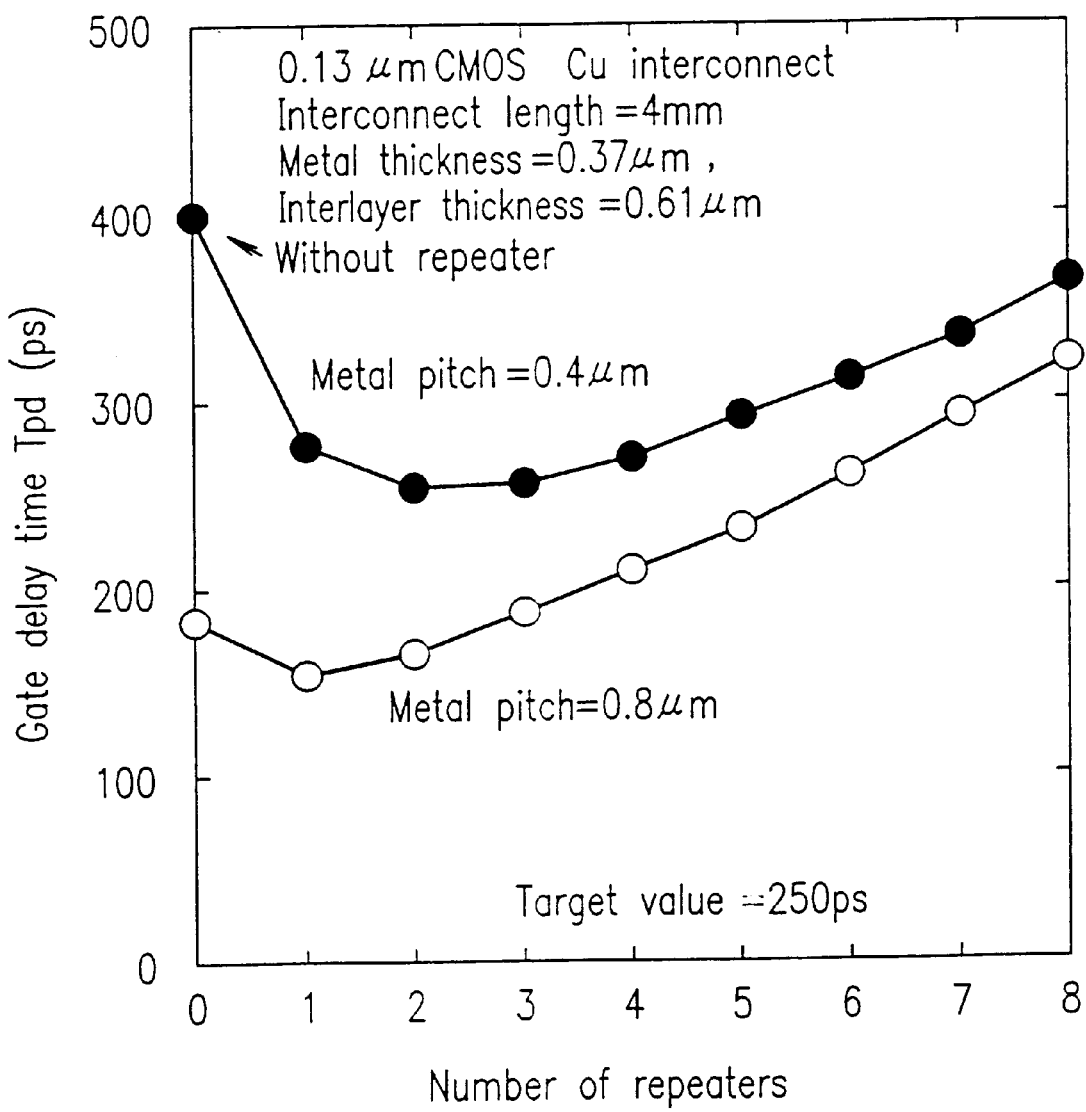
FIG. 9 is a graph illustrating a relationship between the number of repeaters inserted and the gate delay time Tpd.

On the other hand, when n repeaters are inserted, the gate delay time increases to a value which is n times as large as the value of the gate delay time tpd in the case where there is no wiring load in Formula (4) above. Therefore, there is an optimal number of repeaters to be inserted. FIG. 9 shows an exemplary result of the gate delay time Tpd calculated when n repeaters are inserted. The technological conditions for the calculation are as follows: 0.13 $\mu$m generation; Cu interconnect; a relative dielectric constant of the interlayer insulating film of 2.6; an interconnect length of 4 mm; a metal thickness of 0.37 $\mu$m; and an interlayer thickness of 0.61 $\mu$m. FIG. 9 shows the data for the metal pitches of 0.4 $\mu$m and 0.8 $\mu$m under the above technological conditions, represented respectively by black circular plots and white circular plots.

As is clear from FIG. 9, with the metal pitch of 0.8 $\mu$m, the optimal number of repeaters to be inserted equals one while with the metal pitch of 0.4 $\mu$m, the optimal number of repeaters to be inserted equals to 2. "The optimal number of repeaters to be inserted" used herein refers to the number of repeaters which makes the gate delay time Tpd the smallest.

Referring back to FIG. 3, after inserting the optimal number of repeaters in step 305, it is determined in step 306 whether or not the gate delay time Tpd satisfies the target value. In the case where the target value is satisfied, the process is terminated. Otherwise, the routine proceeds to step 307.

In step 307, the gate delay time Tpd is reduced by widening the metal pitch. Widening the metal pitch means widening the metal width and the metal space. This makes it possible to reduce the wiring resistance Rw while maintaining the wiring capacitance Cw substantially at a fixed value in Formula (4) above. Thereafter, the similar determination process as in steps 304 and 306 is again performed in step 308.

Figure 10:
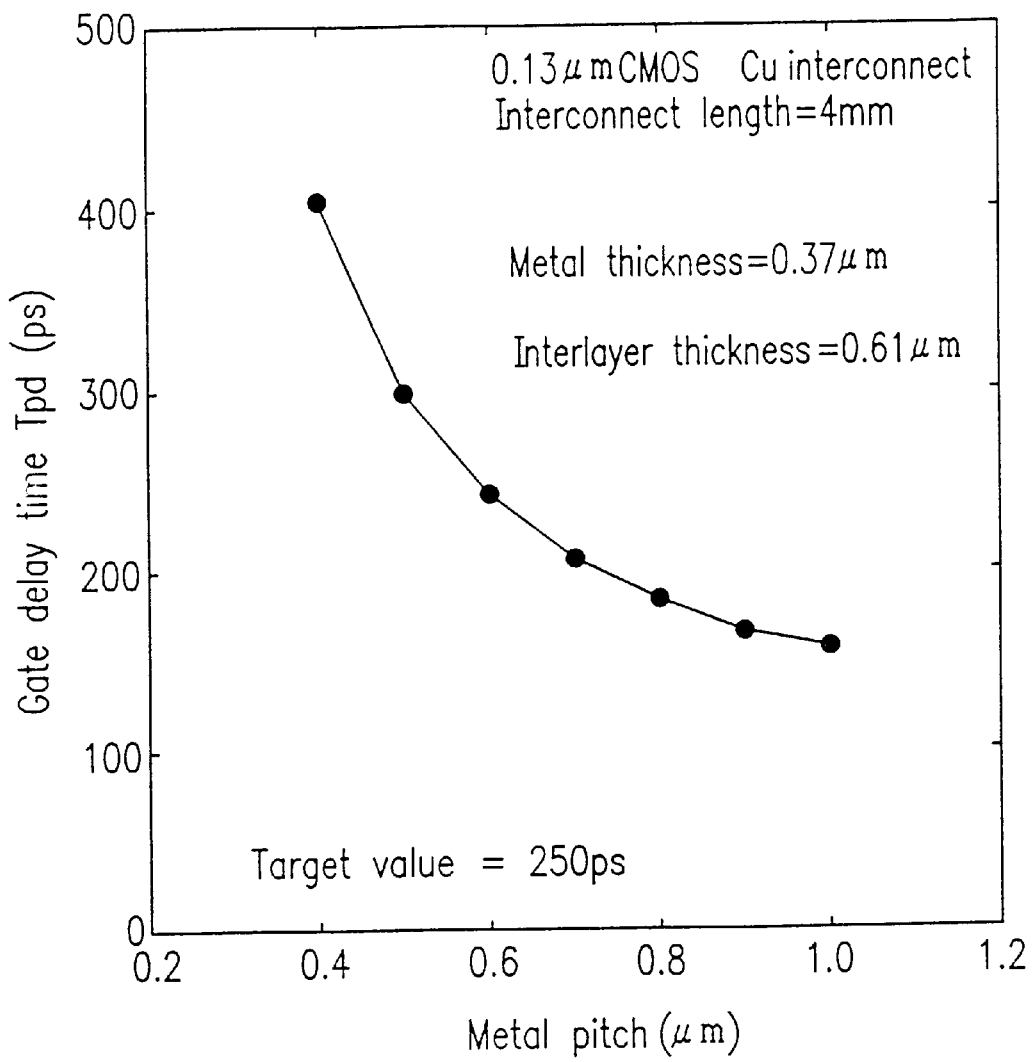
FIG. 10 is a graph illustrating a relationship between the metal pitch and the gate delay time Tpd.

FIG. 10 shows an exemplary result of the gate delay time Tpd calculated for various metal pitches. The technological conditions for the calculation are as follows: 0.13 $\mu$m generation; Cu interconnect; a relative dielectric constant of the interlayer insulating film of 2.6; an interconnect length of 4 mm; a metal thickness of 0.37 μm; and an interlayer thickness of 0.61 μm.

As is clear from FIG. 10, widening the metal pitch reduces the gate delay time Tpd. However, when a metal pitch to be set exceeds a value which is twice as large as the minimum value of the metal pitch resulting from the above technological conditions, the gate delay time Tpd is saturated. This is because the metal pitch exceeding a value which is twice as large as the minimum pitch leads to an increase in the metal width, thereby causing an increase in the wiring capacitance created in the bottom plane of the wiring. Thus, the effect of improving the interconnect delay becomes less significant.

In the process described above, step 303 is first performed. In the case where the target value of the gate delay time Tpd is not satisfied as a result of step 303, step 305 is then performed. In the case where the gate delay time Tpd does not yet satisfy the target value as a result of step 305, step 307 is then performed. In other words, different priorities are respectively assigned to steps 303, 305, and 307. Assignment of such priorities serves to prevent an increase in the area of the LSI chip and the number of the metal layers as much as possible, the reason for which will now be described below.

Implementation of step 303, in which the driver size of the driver gate 1 is increased, causes an increase in the area of the transistor included in the driver gate 1. However, the increased area occupied by the transistor makes up only a very small proportion of the area of the entire logic circuit network. Consequently, the total area increased in step 303 is very small. Step 305, in which a repeater is inserted, on the other hand, imposes a great load on DA (Design Automation), and accordingly, is assigned a lower priority than step 303. As for step 307, in which the metal pitch is widened, the percentage of the wirings which will require the implementation of this step is small in terms of the number, while the percentage thereof in terms of the total interconnect length becomes large. Thus, step 307 is assigned the lowest priority.

FIGS. 11A-1, 11A-2, 11B-1, 11B-2, 11C-1, 11C-2, 11D-1, and 11D-2 sequentially show changes in the circuit pattern resulting from the implementation of steps 303, 305, and 307. FIGS. 11A-1, 11B-1, 11C-1, and 11D-1 are each a circuit diagram, and FIGS. 11A-2, 11B-2, 11C-2, and 11D-2 are each a plan view which images an actual mask pattern.

Specifically, the circuit diagram shown in FIG. 11A-1 and the corresponding plan view shown in Figure 11A-2 illustrate a state of the circuit before the implementation of step 303. The driver gate 1 and the load gate 2 are connected to each other via the wiring 3.

In step 303, the driver size of the driver gate 1 is increased. The result is shown in FIGS. 11B-1 and 11B-2, where the driver gate 1 is replaced with a driver gate 1a. Next, in step 305, the repeater 5 is inserted in the interconnect 3. The resultant configuration is shown in FIGS. 11C-1 and 11C-2, in which the repeater 5 (i.e., CMOS inverters 5a and 5b) is inserted between interconnects 3. Then, in step 307, the metal pitch of the interconnects 3 is widened. This results in the configuration shown in FIGS. 11D-1 and 11D-2, where the interconnects 3 are replaced with wider interconnects 33.

When actually designing an LSI circuit pattern, a process routine following the flowchart shown in FIG. 3 can be incorporated into a DA tool to be used.

Figure 12:
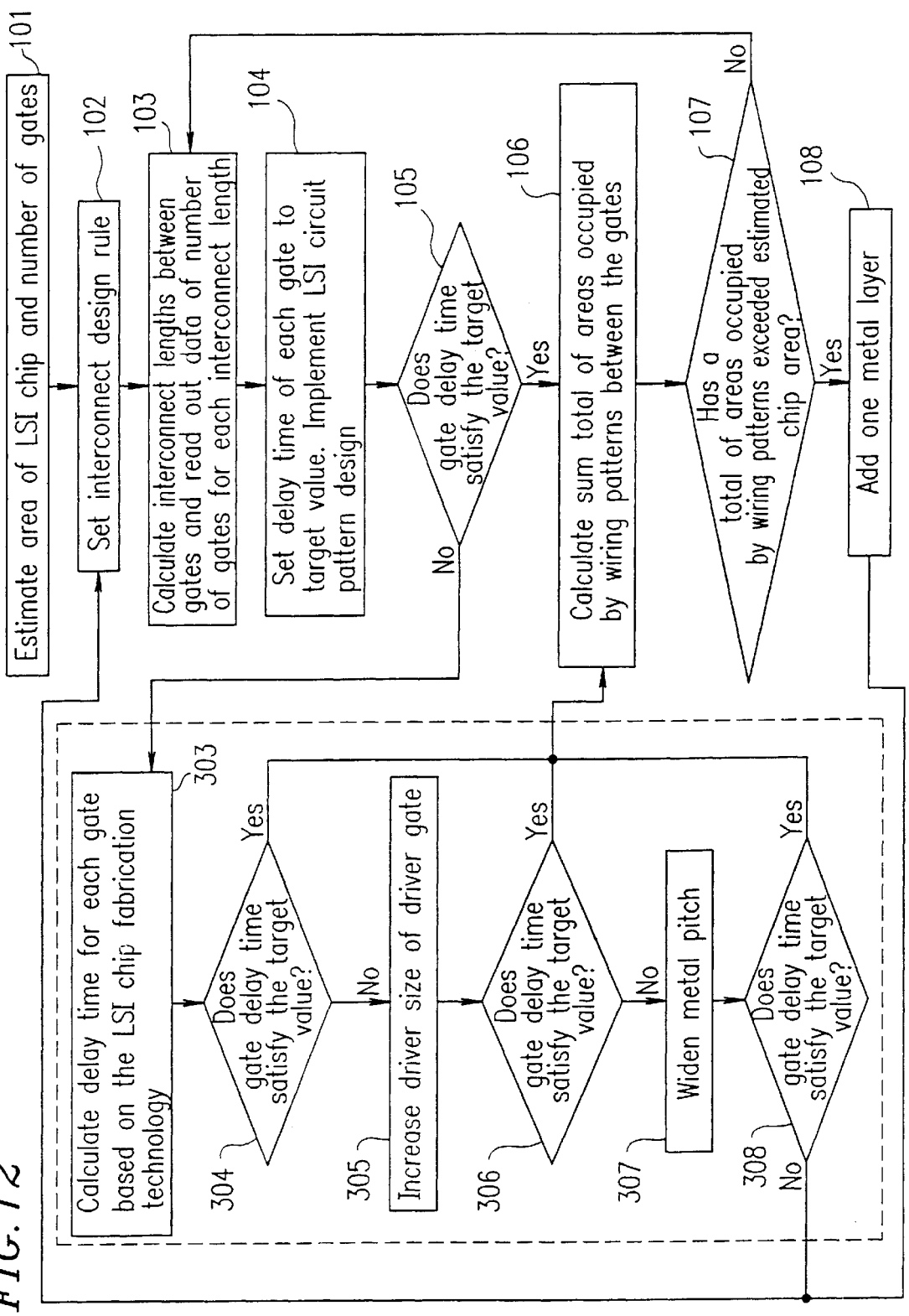
FIG. 12 is a flowchart of a process routine which is obtained by incorporating the process routine shown by the flowchart in FIG. 3 into the process routine shown by the flowchart in FIG. 1.

FIG. 12 is an entire flowchart which is obtained by incorporating the flowchart shown in FIG. 3 for modifying the wiring pattern design, into the flowchart shown in FIG. 1. The description of each step therein will be omitted to avoid a repetition.

Next, with reference to FIG. 13, basis for resetting the metal width and the metal thickness at the time of resetting the interconnect design rule in step 102 in FIG. 1 will be described.

Figure 13:
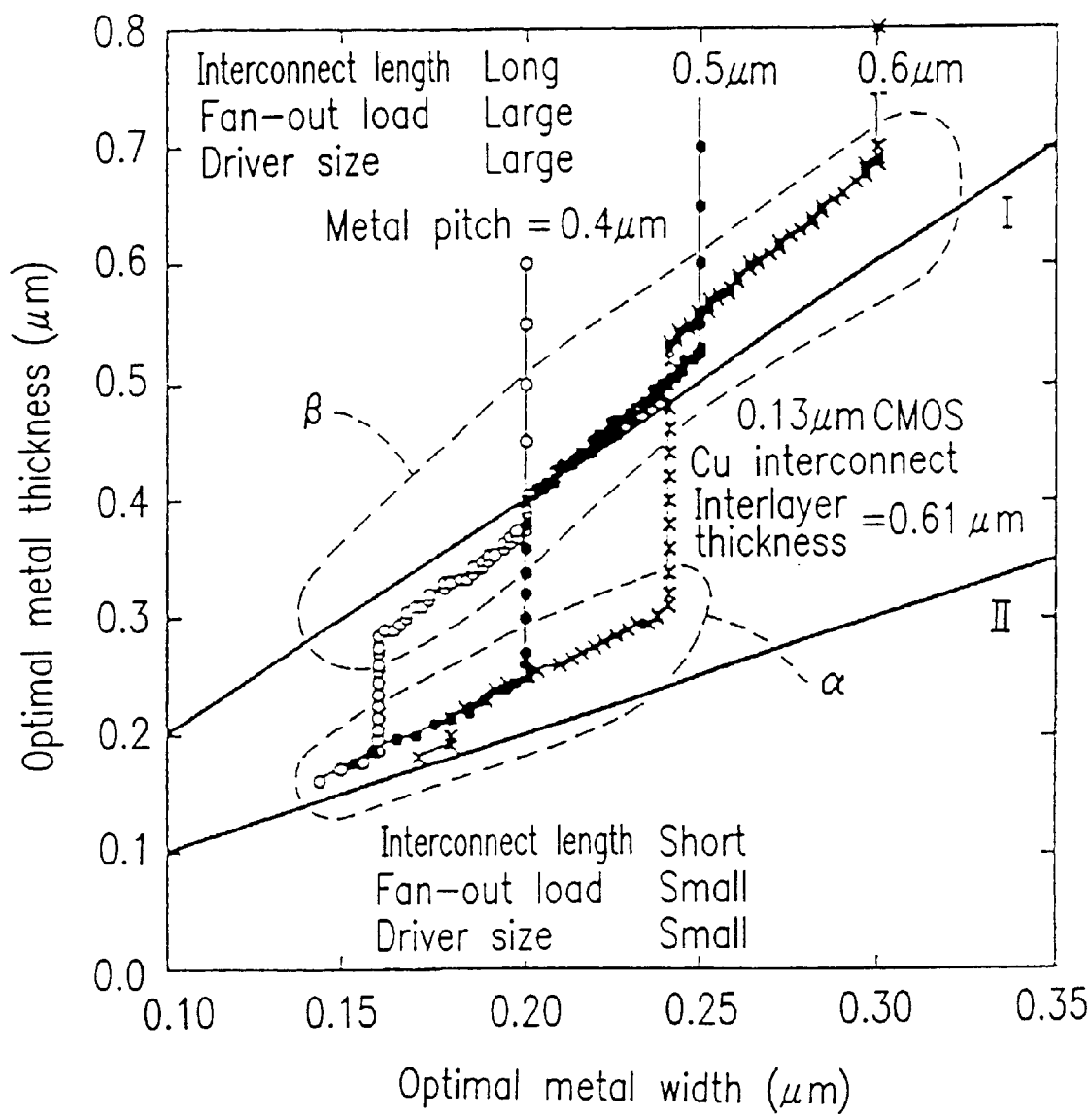
FIG. 13 is a graph illustrating a relationship between an optimal metal width and an optimal metal thickness which results in an optimal gate delay time under prescribed technological conditions.

FIG. 13 shows the relationship between the metal width and the metal thickness from which the optimal gate delay time Tpd is obtained under the following technological conditions: 0.13 μm generation CMOS; Cu interconnect; and an interconnect thickness of 0.61 μm, the data being plotted for each of the 0.4 μm, 0.5 μm, and 0.6 μm metal pitches. Specifically, the white circles represent the data for the metal pitch of 0.4 μm, the black circles represent the data for the metal pitch of 0.5 μm, and the cross marks represent the data for the metal pitch of 0.6 μm. Line I shows the relationship between the metal width and the metal thickness in which the aspect ratio thereof is 1. Line II shows the relationship between the metal width and the metal thickness in which the aspect ratio thereof is 2.

As is clear from FIG. 13, regardless of the metal pitch, certain regularity exists for the aspect ratio between the metal width and the metal thickness from which the optimal gate delay time Tpd is obtained. Specifically, in the vicinity of the region where the aspect ratio between the metal width and the metal thickness is 1 (henceforth referred to simply as "region α"), and in the vicinity of the region where the aspect ratio between the metal width and the metal thickness is 2 (henceforth referred to simply as "region β"), the gate delay time Tpd tends to take on an optimal value. More specifically, the region a corresponds to a region where the aspect ratio takes on a value ranging from 1.0 to 1.2 inclusive, and the region p corresponds to a region where the aspect ratio takes on a value ranging from 1.8 to 2.3 inclusive.

In the case where the aspect ratio which optimizes the gate delay time Tpd is 2 or more, there is no large difference in the value of the gate delay time Tpd, compared to the case where the aspect ratio is 2. Therefore, an aspect ratio of approximately 2 will be sufficient to facilitate production.

A detailed analysis of the data shown in FIG. 13 reveals the following.

A detailed examination of the LSI circuit patterns whose gate delay time Tpd takes on an optimal value in the region a shows that these LSI circuit patterns are characterized by a short interconnect length, a small fan-out load, and a small driver size. These characteristics are unique to the local interconnect (i.e., an interconnect which connects together cells included in a logic circuit block within the logic circuit block). On the other hand, a detailed examination of the LSI circuit patterns whose gate delay time Tpd takes on an optimal value in the region β shows that these LSI circuit patterns are characterized by a long interconnect length, a large fan-out load, and a large driver size. These characteristics are unique to the global interconnect (i.e., an interconnect which connects the logic circuit blocks together).

The above-mentioned global and local interconnects will be described with reference to FIGS. 14A, 14B, and 14C.

FIG. 14A is a plan view schematically illustrating a top image of a chip in which a plurality of blocks are arranged in an array on an X-Y plane. The global interconnects correspond to such interconnects in metal layers M4, M5, and M6, which are provided over a plurality of blocks. FIG. 14B is an enlarged plan view of one block in the array shown in FIG. 14A, schematically illustrating a top image of the block. Each block includes a plurality of cells arranged in an array on an X-Y plane. Interconnects in metal layers M1, M2, and M3 provided over a plurality of cells correspond to the local interconnects.

FIG. 14C is a cross-sectional view taken along a line III—III in FIGS. 14A and 14B, schematically illustrating a layered state of the interconnects in the metal layers M1 through M6. The following can be known from FIG. 14C: the local interconnects are provided in the first (i.e., bottom) metal layer M1 through the third metal layer M3; the local interconnects in the metal layers M1 through M3 each have a cross section whose aspect ratio is approximately 1 (i.e., square cross section); the global interconnects are provided in the fourth metal layer M4 from the bottom through the sixth (i.e, top) metal layer M6; and the global interconnects in the metal layers M4 through M6 each have a cross section whose aspect ratio is approximately 2 (i.e., rectangular cross section whose metal thickness is greater than the metal width). Among the global interconnects, an interconnect having a relatively short interconnect length is provided in the fourth metal layer M4, an interconnect having an intermediate interconnect length is provided in the fifth metal layer M5, and an interconnect having a relatively long interconnect length is provided in the sixth metal layer M6.

The implementation of the resetting of the interconnect design rule in step 102 in the following manner, based on the above results of the analysis, makes it possible to achieve an optimal value of the gate delay time Tpd.

In the case of the wiring pattern which has such characteristics of the local interconnect as a short interconnect length, a small fan-out load, and a small driver size, the resetting of the interconnect design rule so that the aspect ratio between the metal thickness and the metal width becomes closer to 1 (i.e., so that the interconnect has a square cross section) makes it possible to achieve an optimal value of the gate delay time Tpd. On the other hand, in the case of the wiring pattern which has such characteristics of the global interconnect as a long interconnect length, a large fan-out load, and a large driver size, the resetting of the interconnect design rule so that the aspect ratio between the metal thickness and the metal width becomes closer to 2 (i.e., so that the interconnect has a rectangular cross section whose metal thickness is greater than the metal width) makes it possible to achieve an optimal value of guide the gate delay time Tpd.

In this example, step 101 corresponds to a first operation where the area of the LSI chip and the number of necessary gates are estimated. Step 102 corresponds to a step in which the design rule is set and altered. Step 103 corresponds to a second operation where the interconnect lengths between two adjacent gates are estimated (i.e., calculated). Step 104 corresponds to a third operation where the gate delay time for each gate in the designed wiring pattern is calculated. Steps 105 and 106 correspond to a fourth operation for determining a value of the gate delay time and calculating a total of the areas occupied by the wiring patterns. Steps 107 and 108 correspond to a fifth operation for determining a level of the total of the areas occupied by the wiring patterns and increasing the number of the metal layers if necessary.

The above-described process routine of the method for designing an LSI circuit pattern according to the present invention, will be described again, this time with a specific example.

The technological conditions for the example are as follows: 0.13 $\mu$m generation; Cu interconnect; a relative dielectric constant of the interlayer insulating film of 2.6; a minimum metal pitch of 0.4 $\mu$m (i.e., metal width=metal space=0.2 $\mu$m); an area of the LSI chip of 430 mm$^2$; and 10 million gates. The target operation frequency is 600 MHz. A value of the target gate delay time of 250 ps (picoseconds) is obtained when the target gate delay time is set to be 15% of the clock frequency.

As described above, the interconnects in the first metal layer M1 through the third metal layer M3 are used as local interconnects having a very short interconnect length. In this case, the wiring resistance has almost no influence on the delay time, and accordingly, the delay time is governed substantially by the wiring capacitance. Therefore, in order to obtain a small value of the wiring capacitance, the aspect ratio of the interconnects in the metal layers M1, M2, and M3 are set to be 1 so that a square cross section is obtained.

Cu, used as an interconnect material in this embodiment, has an excellent reliability in terms of good electromigration properties, and accordingly, a thin metal film is obtainable. In contrast, when Al is used as an interconnect material, a thin metal thickness cannot be achieved due to the poorer reliability thereof. This necessitates that the aspect ratio be set at approximately 2.

The interconnects in the fourth metal layer M4 have gates having a relatively long (e.g., 4 mm) interconnect length. Accordingly, the aspect ratio of the interconnects in the fourth metal layer M4 needs to be set at 2. The metal pitches of the interconnects in the fifth metal layer M5 and in the sixth metal layer M6 need to be set to be two and four times as large as that of the interconnects in the fourth metal layer M4, respectively, in order to further improve the interconnect delay while maintaining the aspect ratio thereof at 2.

FIGS. 15A-1, 15A-2, 15B-1, 15B-2, 15C-1, 15C-2, 15D-1, 15D-2, 15E-1, 15E-2, 15F-1, 15F-2, 15G-1, and 15G2 are diagrams conceptually illustrating the above-described method for setting the interconnect design rule. FIGS. 15A-1, 15B-1, 15C-1, 15D-1, 15E-1, 15F-1, and 15G-1 are each a plan view illustrating part of a flat mask at each setting step, in which mask patterns for metal layers are arranged side by side in a plane, the mask pattern for an interconnect in a bottom metal layer being the leftmost, and the mask pattern for an interconnect in a top metal layer being the rightmost. FIGS. 15A-2, 15B-2, 15C-2, 15D-2, 15E-2, 15F-2, and 15G-2 are each a cross-sectional view of an interconnect structure corresponding respectively to FIGS. 15A-1, 15B-1, 15C-1, 15D-1, 15E-1, 15F-1, and 15G-1.

In a first step shown in FIGS. 15A-1 and 15A-2, the designing for a gate having a certain interconnect length is performed. As a result, the wiring is set only for a first mask pattern for the wiring in the first (i.e., bottom) metal layer M1 shown in the leftmost part of the FIG. 15A-1 (mask pattern P1*b*), and the wiring is not set for mask patterns P2*a* through P6*a* for other metal layers M2 through M6. Even in the first mask pattern P1*b*, the wiring is set only for a part thereof. Therefore, as shown in FIG. 15A-2, only a part of the interconnect in the first (i.e., bottom) metal layer M1 is formed.

In a second step shown in FIGS. 15B-1 and 15B2, the designing for a gate having a different interconnect length is performed. As a result, the first mask pattern P1*b* is filled, and a pattern of the interconnect in the first metal layer M1 is determined. Therefore, in a third step shown in FIGS. 15C-1 and 15C-2, the interconnect is set for the second mask pattern corresponding to the interconnects in the second metal layer M2 (mask pattern P2*b*).

Thereafter, the designing for a gate having a different interconnect length is sequentially performed, and a wiring pattern is assigned for each of the remaining metal layers (and the corresponding mask patterns) in an ascending order toward the top metal layer M6, thereby setting the interconnects for each metal layer. In this process, the cross section of the interconnects tends to increase in an ascending order toward the top metal layer M6.

In this example, an interconnect having a shorter interconnect length is provided in a lower metal layer, and an interconnect having a longer interconnect length is provided in a upper metal layer. This order is slightly altered in an actual designing process. As a rule, however, the number of metal layers is minimized by providing an interlayer having a shorter interconnect length in a lower metal wiring layer and an interconnect having a longer interconnect length in a upper metal layer. Therefore, when incorporating the prevent invention into the actual DA tool, it is useful to include the above function therein.

Furthermore, in the above description, the interconnects in the first metal layer M1 through the fourth metal layer M4 have the same metal pitch, and the interconnects in the fifth metal layer M5 and in the sixth metal layer M6 each have a different metal pitch. In contrast, in the actual designing process, it is often necessary that two metal layers having the same properties, that is, one in the X direction and one in the Y direction, be stacked with each other. In general, it is impossible to include in a single metal layer the X-direction interconnect and the Y-direction interconnect located on the same level. However, this is made possible, for example, by allowing one of the X-direction interconnect and the Y-direction interconnect located on the same level in the single metal layer to locally bypass to another metal layer located thereabove or thereunder through a via (i.e., a contact connecting the two vertically provided interconnects) at a point where the X-direction interconnect and the Y-direction interconnect are to intersect.

In the case where an occurrence of a resistance component due to the via presents a problem, contacts can be secured in parallel at a plurality of positions by providing a plurality of vias. Inclusion of such a function in the actual DA tool is useful since the inclusion makes it possible to minimize the number of metal layers.

By performing the above operations according to the method for designing an LSI circuit pattern of the present invention, the interconnect design rule and the number of metal layers which optimize the performance of the LSI chip level can be determined.

When actually designing an LSI circuit pattern, the designing process can be performed by incorporating the process routine shown by the flowchart in FIG. 3 into the DA tool to be used. Alternatively, the use of the process routine shown by the flowchart in FIG. 12 in the actual DA tool makes it possible to determine the interconnect design rule and the number of metal layers with higher precision.

Furthermore, by performing a calculation for several kinds of chips which are expected to be produced in a certain generation in the process shown by the flowchart in FIG. 12 (so that the estimated area of the LSI chip, number of gates, and operation frequency are achieved), the number of metal layers for the various kinds of LSI chips, which are expected to be produced with a certain generation, can be determined. This makes it possible to estimate the number of the various kinds of LSI chips to be produced, which in turn makes it possible to calculate an estimated value of a total production time required by the implementation of the interconnect process. As a result, the scale of manufacturing facilities and the number of apparatuses required for fabrication can be accurately estimated.

As described above, according to the method for designing an LSI circuit pattern of the present invention, the delay time of the gate included in the circuit pattern can be calculated with precision. Moreover, even in the case of a multilayered interconnect structure having five metal layers or more, the gate delay time can be set at or below the target value while restricting an increase in the number of metal layers and the area of the LSI chip as much as possible. As a result, the circuit design pattern (i.e., the interconnect design rule and the number of metal layers) which optimizes the performance of the LSI chip level can be obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for designing an LSI circuit pattern for pattern-designing a plurality of gates and a wiring pattern which connects the plurality of gates on an LSI chip, the method comprising:

a first step of estimating a chip area of the LSI chip and a number of the plurality of gates required for achieving a desired function;

a second step of estimating an interconnect length of each of the plurality of gates;

a third step of designing a wiring pattern associated with the each of the plurality of gates based on a prescribed design rule sequentially from a gate having the shortest interconnect length, and calculating a gate delay time for the design wiring pattern;

a fourth step of repeating at least one of the second and third steps after altering the design rule in the case where the calculated gate delay time exceeds a prescribed target value, while calculating a total of areas occupied by the designed wiring patterns in the case where the calculated gate delay time is at or below the prescribed target value; and a fifth step of sequentially performing the third and fourth steps for a gate having a next shortest interconnect length in the case where the calculated total of areas occupied by the designed wiring patterns does not exceed the chip area estimated in the first step, while in the case where the calculated total of areas occupied by the designed wiring patterns exceeds the chip area estimated in the first step, adding one new metal layer and sequentially performing the third and fourth steps for the gate having a next shortest interconnect length on the added metal layer.

2. A method for designing an LSI circuit pattern according to claim 1, wherein the LSI circuit pattern includes a configuration in which a driver gate and a plurality of load gates are connected by a wiring branched in the middle thereof, and in the third step, a portion of the wiring extending from the driver gate to a load gate of interest included in the plurality of load gates is set to be a wiring of interest, while a portion of the wiring extending from a wiring branch point on the wiring of interest to a load gate of no interest included in the plurality of load gates is set to be a branch wiring, and an actual gate delay time is calculated by correcting a gate delay time obtained in the case where there is no wiring load and by using a formula below:

$$Tpd = tpd + Rtr \times (Cd + Cw) + Rw \times k1 \times Cf + Rw \times k2 \times Cd + Rw \times k3 \times Cw;$$

wherein tpd: the gate delay time obtained in the case where there is no wiring load;

Rtr: an ON resistance of a transistor included in the driver gate;

Cf: a total value of fan-out capacitances of transistors included in the respective load gates;

Cd: a wiring capacitance of the branch wiring;

Cw: a wiring capacitance of the wiring of interest; and

Rw: a wiring resistance of the wiring of interest; and k1, k2 and k3: a constant which takes on a value ranging from 0 to 1 inclusive.

3. A method for designing an LSI circuit pattern according to claim 2, wherein values of tpd, the Rtr, the Cf, and the k3 are each determined by performing a circuit simulation using the Cw and the Rw as parameters.

4. A method for designing an LSI circuit pattern according to claim 2, wherein in the case where a number of the plurality of load gates is set to be n (n: natural number), the term Rw×k1×Cf included in the above formula is calculated from formulae below:

$$Rw \times k1 \times Cf = Rw \times (k1_1 \times Cf_1 + k1_2 \times Cf_2 + \ldots + k1_{n-1} \times Cf_{n-1} + k1_n \times Cf_n);$$
and $$k1_1 = L_1/L, \ldots, k1_n = l/L,$$

wherein $Cf_1$ through $Cf_n$: a fan-out capacitance of each of the plurality of load gates;

$L_1$ through $L_n$: a wiring distance of the wiring of interest from the driver gate to the wiring branch point respectively corresponding to the plurality of load gates; and L: a total wiring distance of the wiring of interest.

5. A method for designing an LSI circuit pattern according to claim 2, wherein in the case where a number of the branch wirings is set to be m (m: natural number), the term Rw×k2×Cd included in the above formula is calculated from formulae below:

$$Rw \times k2 \times Cd = Rw \times (k2_1 \times Cd_1 + k2_2 \times Cd_2 + \ldots + k2_{m-1} \times Cd_{m-1} + k2_m \times Cd_m);$$ and $$k2_1 = k3 \times (D_1/L), \ldots, k2_n = k3 \times (D_m/L),$$

wherein $Cd_1$ through $Cd_m$: the wiring capacitance of each of the branch wirings;

$D_1$ through $D_m$: a wiring distance of the wiring of interest from the driver gate to the wiring branch point respectively corresponding to the branch wirings; and L: a total wiring distance of the wiring of interest.

6. A method for designing an LSI circuit pattern according to claim 1, further comprising the steps of:

increasing a driver size of a driver gate included in the plurality of gates in the case where the gate delay time, calculated upon designing the plurality of gates in the wiring patterns on the LSI chip, exceeds the prescribed target value;

inserting a repeater between the driver gate and the load gate included in the plurality of gates in the case where a gate delay time recalculated after the step of increasing a driver size exceeds the prescribed target value; and widening a metal pitch of the wiring pattern in the case where a gate delay time recalculated after the step of inserting a repeater exceeds the prescribed target value.

7. A method for designing an LSI circuit pattern according to claim 1, wherein upon altering the design rule:

a wiring pattern of local interconnects for connecting together cells included in a logic circuit block within the logic circuit block is pattern-designed through a use of an interconnect having an interconnect structure whose aspect ratio between a metal thickness and a metal width is close to 1; and a wiring pattern of global interconnects for connecting the logic circuit blocks together is pattern-designed through a use of an interconnect having an interconnect structure whose aspect ratio is close to 2.

8. A method for designing an LSI circuit pattern according to claim 7, wherein the interconnect is made of copper.

9. A method for designing an LSI circuit pattern which includes a configuration in which a driver gate and a plurality of load gates are connected by a wiring branched in the middle thereof, wherein, a portion of the wiring extending from the driver gate to a load gate of interest included in the plurality of load gates is set to be a wiring of interest, while a portion of the wiring extending from a wiring branch point on the wiring of interest to a load gate of no interest included in the plurality of load gates is set to be a branch wiring, and an actual gate delay time is calculated by correcting a gate delay time obtained in the case where there is no wiring load and by using a formula below:

$$Tpd = tpd + Rtr \times (Cd+Cw) + Rw \times k1 \times Cf + Rw \times k2 \times Cd + Rw \times k3 \times Cw,$$

wherein tpd: the gate delay time obtained in the case where there is no wiring load;

Rtr: an ON resistance of a transistor included in the driver gate;

Cf: a total value of fan-out capacitances of transistors included in the respective load gates;

Cd: a wiring capacitance of the branch wiring;

Cw: a wiring capacitance of the wiring of interest;

Rw: a wiring resistance of the wiring of interest; and k1, k2 and k3: a constant which takes on a value ranging from 0 to 1 inclusive.

10. A method for designing an LSI circuit pattern for pattern-designing a plurality of gates and a wiring pattern which connects the plurality of gates on an LSI chip, the method comprising the steps of:

increasing a driver size of a driver gate included in the plurality of gates in the case where the gate delay time, calculated upon designing the plurality of gates in the wiring patterns on the LSI chip, exceeds the prescribed target value;

inserting a repeater between the driver gate and the load gate included in the plurality of gates in the case where a gate delay time recalculated after the step of increasing a driver size exceeds the prescribed target value; and widening a metal pitch of the wiring pattern in the case where a gate delay time recalculated after the step of inserting a repeater exceeds the prescribed target value.

11. A method for designing an LSI circuit pattern for pattern-designing a plurality of gates and a wiring pattern which connects the plurality of gates on an LSI chip, wherein:

a wiring pattern of local interconnects for connecting together cells included in a logic circuit block within the logic circuit block is pattern-designed through a use of an interconnect having an interconnect structure whose aspect ratio between a metal thickness and a metal width is close to 1; and a wiring pattern of global interconnects for connecting the logic circuit blocks together is pattern-designed through a use of an interconnect having an interconnect structure whose aspect ratio is close to 2.

12. A method for designing an LSI circuit pattern according to claim 11, wherein the interconnect is made of copper.

13. A method according to claim 11, wherein said LSI chip has multilayered interconnect structure having five or more metal layers.

* * * * *

UNITED STATES PATENT AND TRADEMARK OFFICE
CERTIFICATE OF CORRECTION

PATENT NO.   : 6,205,570 B1
DATED        : March 20, 2001
INVENTOR(S)  : Yamashita It is certified that error appears in the above-identified patent and that said Letters Patent is hereby corrected as shown below:

<u>Column 21,</u>
Line 10, delete "and".
Line 27, "$kl_1 = L_1 / L, \ldots, kl_n = / L,$" should read -- $kl_1 = L_1 / L, \ldots, kl_n = L_n / L,$ --.

Signed and Sealed this

Fourth Day of September, 2001

Attest:

*Nicholas P. Godici*

*Attesting Officer*

NICHOLAS P. GODICI
*Acting Director of the United States Patent and Trademark Office*